United States Patent [19]
Ohuchi

[11] Patent Number: 5,877,542
[45] Date of Patent: Mar. 2, 1999

[54] PLASTIC MOLDED TYPE SEMICONDUCTOR DEVICE

[75] Inventor: Shinji Ohuchi, Tokyo, Japan

[73] Assignee: OKI Electric Industry Co., Ltd., Tokyo, Japan

[21] Appl. No.: 847,980

[22] Filed: Apr. 24, 1997

[30] Foreign Application Priority Data

May 16, 1996 [JP] Japan .................................... 8-121196
Oct. 18, 1996 [JP] Japan .................................... 8-276018

[51] Int. Cl.⁶ ................................................ H01L 23/495
[52] U.S. Cl. ........................................ 257/667; 257/786
[58] Field of Search .................... 257/667, 686, 257/778, 666, 786

[56] References Cited

U.S. PATENT DOCUMENTS 5,583,375 12/1996 Tsubosaki et al. ................. 257/686
5,684,330 11/1997 Lee ..................................... 257/778

Primary Examiner—Peter Toby Brown
Assistant Examiner—Roy Potter
Attorney, Agent, or Firm—Venable; Robert J. Frank; Allen Wood

[57] ABSTRACT

Disclosed herein are a plastic molded type semiconductor device and a method of manufacturing the semiconductor device. The semiconductor device includes a semiconductor element having electrodes provided on a surface thereof, a dambar formed along the outer periphery of the surface of the semiconductor element, a plurality of leads respectively electrically connected to the electrodes and provided inside the dambar but electrically independent of the dambar, and a mold resin body within a region surrounded by the dambar and formed so as to expose parts of the leads.

18 Claims, 21 Drawing Sheets

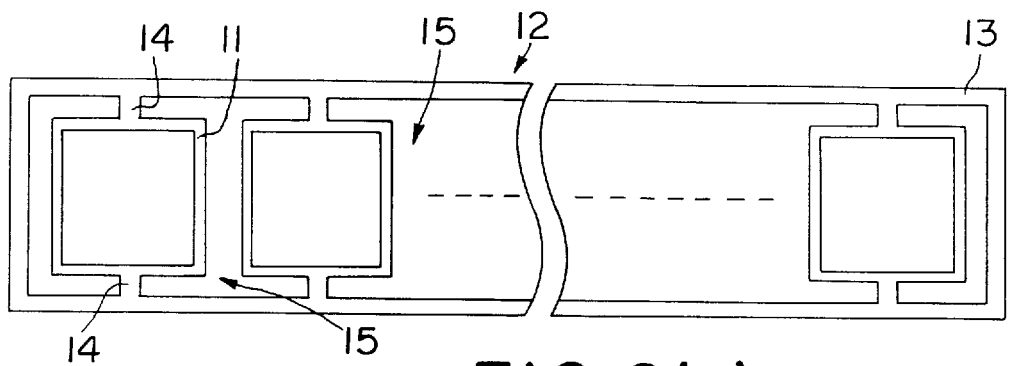
FIG. 2(a)
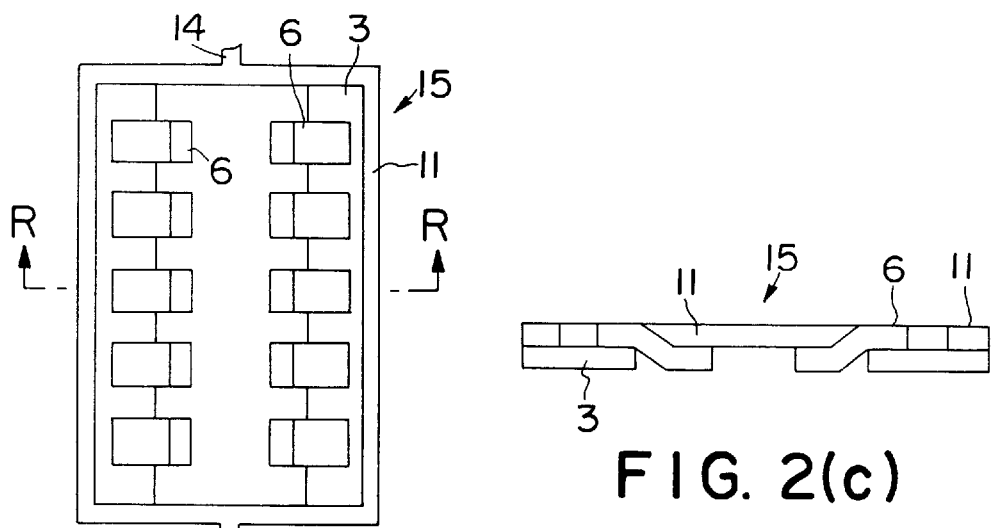
FIG. 2(b)
FIG. 2(c)
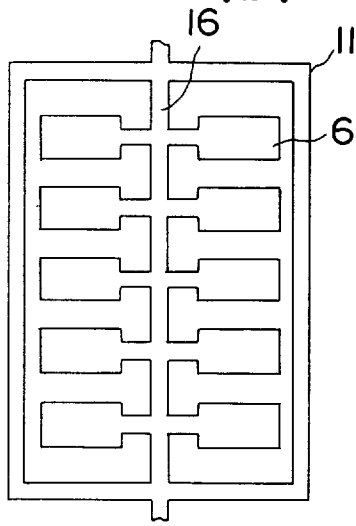
FIG. 2(d)
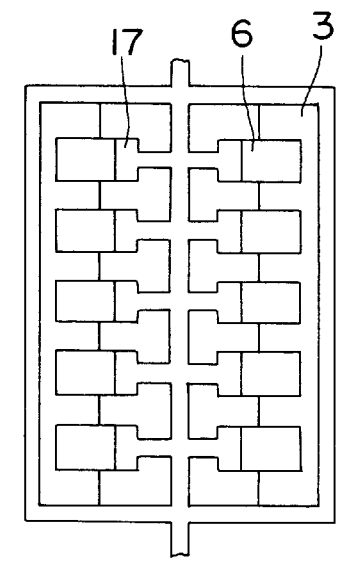
FIG. 2(e)

PLASTIC MOLDED TYPE SEMICONDUCTOR DEVICE

BACKGROUND OF THE INVENTION

1. Field of the Invention

This invention relates to a plastic molded type semiconductor device and a method of manufacturing it.

2. Description of the Related Art

With rapid advances in ICs and memory cards, there has recently been a demand for thin ones as plastic molded type semiconductor devices installed in the cards. As methods of realizing the thin-type semiconductor devices, a vast number of proposals have been made. One example is shown in FIGS. 25(a) and 25(b).

In FIGS. 25(a) and 25(b), reference numeral 1 indicates a plastic molded type semiconductor device and reference numeral 2 indicates a semiconductor element. The semiconductor element 2 has one surface to which a chip support 4 is bonded and fixed by an insulating adhesive tape 3. Further, leads 6 are electrically connected to the semiconductor element 2 through gold wires 5 connected to both sides of the chip support 4. The plastic molded type semiconductor device 1 is formed by sealing the semiconductor element 2 with a mold resin 7 so that the upper surface of the chip support 4 and the bottom face of the semiconductor element 2 are exposed.

According to such a structure, since the bottom face of the semiconductor element 2 is not covered with the mold resin 7 in particular, the semiconductor device can be made thin correspondingly.

However, if consideration is given to an area for the implementation of the semiconductor device 1 on a printed board even though the thickness of the plastic molded type semiconductor device 1 can be thinned, an area much wider than the size of the semiconductor element 2 is required as its implementation area because the leads 6 extend long toward the outside of the mold resin 7. Thus, if the implementation of the plastic molded type semiconductor device 1 on the printed board is taken into consideration, then problems to be improved still remain to realize denser packing.

SUMMARY OF THE INVENTION

With the foregoing in view, it is an object of the present invention to provide a plastic molded type semiconductor device capable of being more densely implemented on a printed board and a method of manufacturing the semiconductor device. The plastic molded type semiconductor device of the present invention comprises a semiconductor element having electrodes provided on a surface thereof, a dambar formed along the outer periphery of the surface of the semiconductor element, a plurality of leads respectively electrically connected to the electrodes and provided inside the dambar electrically independent of the dambar, and a mold resin formed within a region surrounded by the dambar and formed so as to expose parts of the leads.

In order to achieve the above object, there is provided a plastic molded type semiconductor device of the present invention, comprising:

a semiconductor element having electrodes provided on a surface thereof;

a dambar formed along the outer periphery of the surface of the semiconductor element;

a plurality of leads respectively electrically connected to the electrodes and provided inside the dambar electrically independent of the dambar; and a mold resin formed within a region surrounded by the dambar and formed so as to expose parts of the leads.

Typical ones of various inventions of the present application have been shown in brief. However, the various inventions of the present application and specific configurations of these inventions will be understood from the following description.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIG. 1 schematically shows the configuration of a first embodiment of a plastic molded type semiconductor device of the present invention, wherein

FIG. 2 illustrates a method of manufacturing the semiconductor device shown in FIG. 1, wherein FIG. 2(a) is a plan view schematically showing the configuration of a prepared lead frame, FIG. 2(b) is a plan view schematically illustrating a lead frame body, FIG. 2(c) is a cross-sectional view as seen in the direction indicated by arrows R, R in FIG. 2(b), and FIGS. 2(d) and 2(e) are respectively views for describing the lead frame body shown in FIG. 2(b);

FIG. 3 shows the method shown in FIG. 1 and illustrates a state in which a mold is sealed with a resin, wherein

FIG. 4 illustrates the method shown in FIG. 1, wherein

FIG. 6 illustrates a second modification of the manufacturing method shown in FIGS. 2 through 4, wherein

FIG. 7 shows a third modification of the manufacturing method shown in FIGS. 2 through 4, wherein

FIG. 8 depicts a fourth modification of the manufacturing method shown in FIGS. 2 through 4, wherein

FIG. 9 shows a fifth modification of the manufacturing method shown in FIGS. 2 through 4, wherein

10(a) is a fragmentary cross-sectional side view of a mold to be used.

FIG. 11 depicts a seventh modification of the manufacturing method shown in FIGS. 2 through 4, wherein

FIG. 12 illustrates an eighth modification of the manufacturing method shown in FIGS. 2 through 4, wherein

FIG. 13 shows a modification of the first embodiment of the plastic molded type semiconductor device shown in FIG. 1, wherein

FIG. 15 illustrates a method of manufacturing the semiconductor device shown in FIG. 14, wherein

FIG. 16 shows a third embodiment of a plastic molded type semiconductor device of the present invention, wherein

FIG. 17 illustrates a method of manufacturing the semiconductor device shown in FIG. 16, wherein

FIG. 18 schematically shows the configuration of one example of a semiconductor device obtained by a manufacturing method according to the present invention, wherein

FIG. 20 shows a fourth embodiment of a plastic molded type semiconductor device of the present invention, wherein

FIG. 21 illustrates the fourth embodiment shown in FIG. 20, wherein

FIG. 23 illustrates a lead frame employed in the fifth embodiment shown in FIG. 22, wherein

FIG. 24 illustrates a sixth embodiment of a plastic molded type semiconductor device of the present invention, wherein FIG. 25 schematically shows the configuration of one example of a conventional plastic molded type semiconductor device, wherein

DETAILED DESCRIPTION OF THE PREFERRED EMBODIMENTS

Figure 1A:
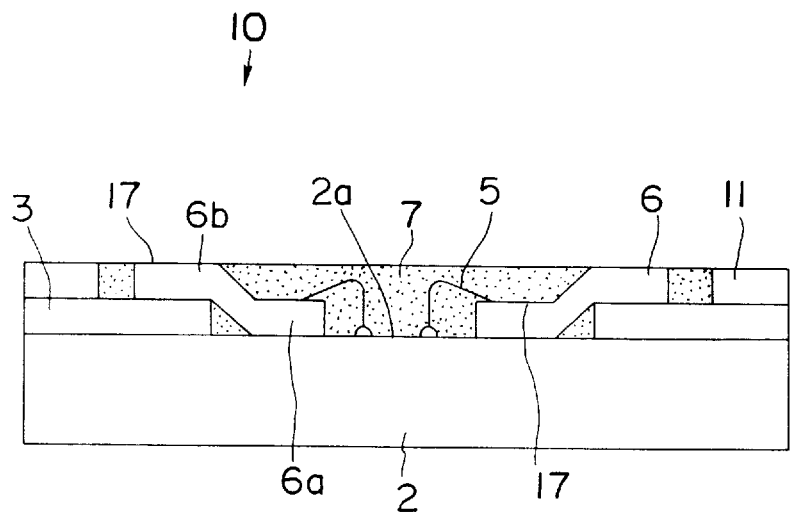
FIG. 1(a) is a cross-sectional side view of the first embodiment and FIG. 1(b) is a perspective view of the first embodiment.
Figure 1B:
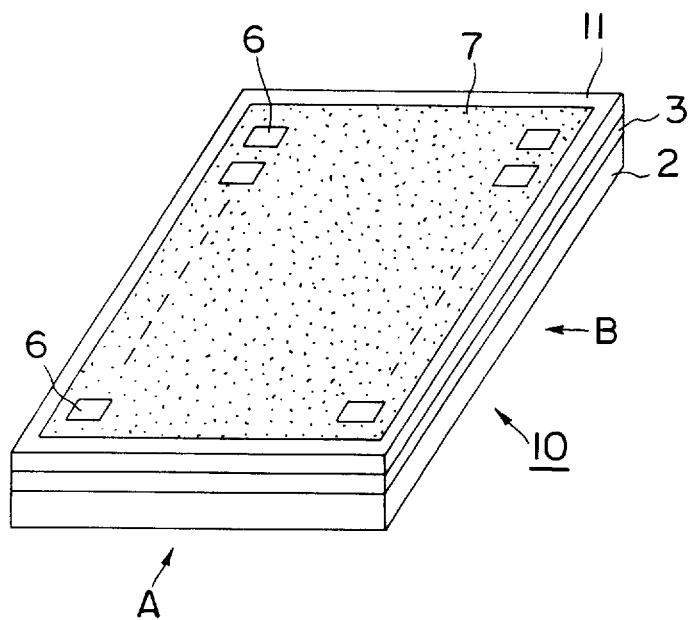
Figure 25A:
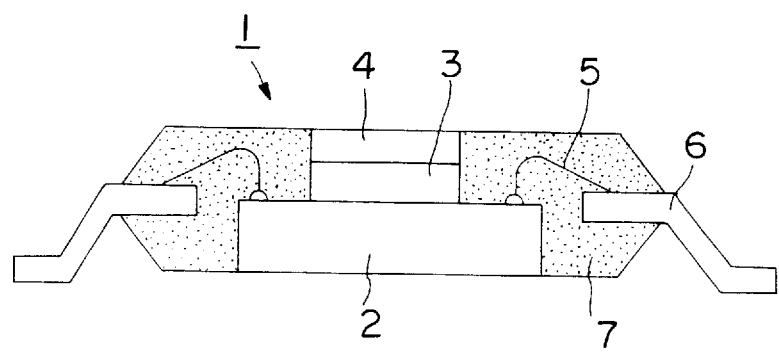
FIG. 25(a) is a cross-sectional side view of the semiconductor device.
Figure 25B:
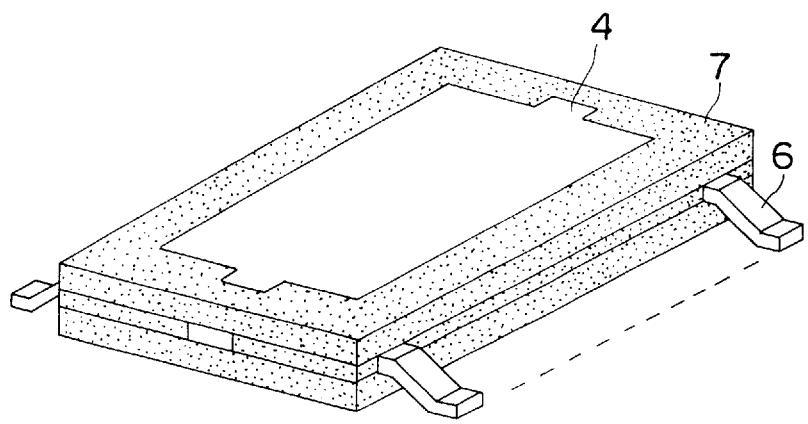
FIG. 25(b) is a perspective view thereof.

FIGS. 1(a) and 1(b) respectively show a first embodiment of the present invention. In these drawings; the same elements of structure as those shown in FIGS. 25(a) and 25(b) are identified by the same reference numerals (the drawings illustrative of a second embodiment and embodiments subsequent thereto, which will be described below, are also similar to the above).

Referring to FIGS. 1(a) and 1(b), reference numeral 10 indicates a resin or plastic molded type semiconductor device (hereinafter abbreviated as "semiconductor device"). As shown in FIG. 1(a), the semiconductor device 10 comprises a rectangular and plate-shaped semiconductor element 2, a plurality of leads 6 electrically connected to a circuit forming surface 2a of the semiconductor element 2, a plurality of gold lines or wires 5 for respectively electrically connecting the semiconductor element 2 and the leads 6 to each other on the circuit forming surface 2a, and an insulating adhesive tape 3 provided between the leads 6 and the semiconductor element 2 so as to fix the leads 6 to the semiconductor element 2.

The leads 6 are disposed over the circuit forming surface 2a of the semiconductor element 2 and do not extend past the sides of the circuit forming surface 2a. Further, the leads 6 are respectively subjected to downset processing so as to be formed with differences in level by the thickness of the adhesive tape 3. A lower portion 6a of each lead 6 is brought into contact with the semiconductor element 2, whereas an upper portion 6b thereof is bonded and fixed onto the semiconductor element 2 with the adhesive tape 3 interposed therebetween. As shown in FIG. 1(b), these leads 6 are provided over the semiconductor element 2 in two rows. Incidentally, the gold wires 5 for respectively electrically connecting the leads 6 and the semiconductor element 2 to one another are electrically connected to their corresponding upper surfaces of the lower portions 6a of the leads 6 and are disposed so as not to extend out upwardly from the upper surfaces of the upper portions 6b of the leads 6.

The adhesive tape 3 is composed of, for example, a polyimide resin and has unillustrated adhesive layers formed on both surfaces thereof. Further, the adhesive tape 3 is shaped in the form of a rectangular frame and bonded onto the circuit forming surface 2a in a state in which its outer peripheral edge is substantially matched with the corresponding outer shape of the circuit forming surface 2a.

Further, a dambar 11 is fixed onto the circuit forming surface 2a of the semiconductor element 2 by the adhesive tape 3. The dambar 11 has an outer shape substantially identical to the outer shape of the circuit forming surface 2a and is formed in the same thickness as that of each lead 6. Moreover, the dambar 11 does not make contact with the leads 6 and is disposed so that its outer edge substantially coincides with the outer edge of the circuit forming surface 2a.

A mold resin 7 is charged and hardened inside the dambar 11 on the circuit forming surface 2a of the semiconductor element 2. Thus, the circuit forming surface 2a is sealed by the mold resin 7 in a state in which the upper surface of the dambar 11 and the upper surfaces of the upper portions 6a of the leads 6 have been exposed. In the semiconductor device 10, the semiconductor element 2 thereof has surfaces other than the circuit forming surface 2a, which have been exposed under the aforementioned resin sealing of the circuit forming surface 2a by the mold resin.

A method of manufacturing the semiconductor device 10 will next be described.

A lead frame 12 shown in FIG. 2(a) is first prepared. The lead frame 12 comprises a metal lead frame member 13 shaped in the form of a rectangular frame, and a plurality of lead frame bodies 15 connected to the inside of the lead frame member 13 through metal dambar supports 14. As shown in FIGS. 2(b) and 2(c), the lead frame bodies 15 are respectively formed of metal dambars 11 shaped in the form of rectangular frames, which are connected to one another through the dambar supports 14, a plurality of metal leads 6 disposed within each dambar 11 without contacting the dambar 11, and an adhesive tape 3 for coupling these leads 6 to the dambars 11.

In order to fabricate each lead frame body 15, as the lead frame body, one is first prepared as shown in FIG. 2(d), which comprises a dambar 11, a lead support 16 connected to the dambar 11, and leads 6 respectively coupled to both sides of the lead support 16. Next, the connecting sides of the leads 6, i.e., the ends thereof on the lead support 16 side are given metal plating 17 as shown in FIG. 2(e). Further, the adhesive tape 3 is placed on the surfaces of the leads 6, which are opposite to the surfaces thereof provided with the metal plating 17. The adhesive tape 3 is a frame-shaped one having an outer shape substantially identical to that of the dambar 11. Further, as the adhesive tape 3, one is used which covers the entire back (corresponding to the same surface as the surface on the side opposite to each metal plating 17 applied to each lead 6) of the dambar 11 and has shapes and dimensions required to couple the dambar 11 and the leads 6 to one another. In regard to the portions stuck on the leads 6, however, the size of the adhesive tape 3 is adjusted so that the adhesive tape 3 is bonded only onto the back of each lead 6 on the side uncoated with the metal plating 17.

After the dambar 11 and the leads 6 have been coupled to each other by the adhesive tape 3, the downset processing is applied to the side of each lead 6 to which no adhesive tape 3 is bonded. Further, the lead support 16 is separated from the dambar 11 and the leads 6 to obtain the lead frame body 15 shown in FIGS. 2(b) and 2(c).

Next, the lead frame 12, which has been prepared in this way, is placed on the semiconductor element 2 in such a manner that the outer edge of the dambar 11 of the lead frame body 15 substantially coincides with the outer edge of the circuit forming surface of the semiconductor element 2. Further, the leads 6 and the dambar 11 are fixed onto the semiconductor element 2 with the adhesive tape 3 by thermo compression bonding.

Figure 3A:
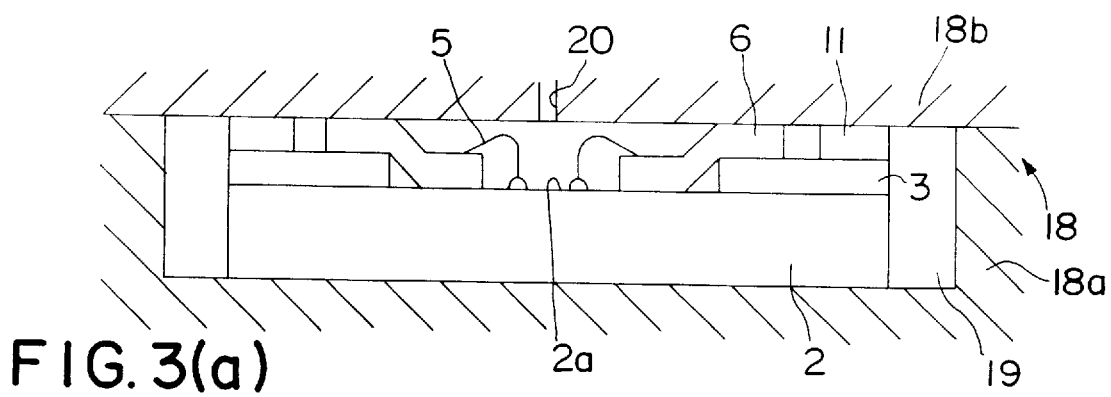
FIG. 3(a) is a fragmentary cross-sectional side view showing a side as seen in the direction indicated by arrow A in FIG. 1(b)
Figure 3B:
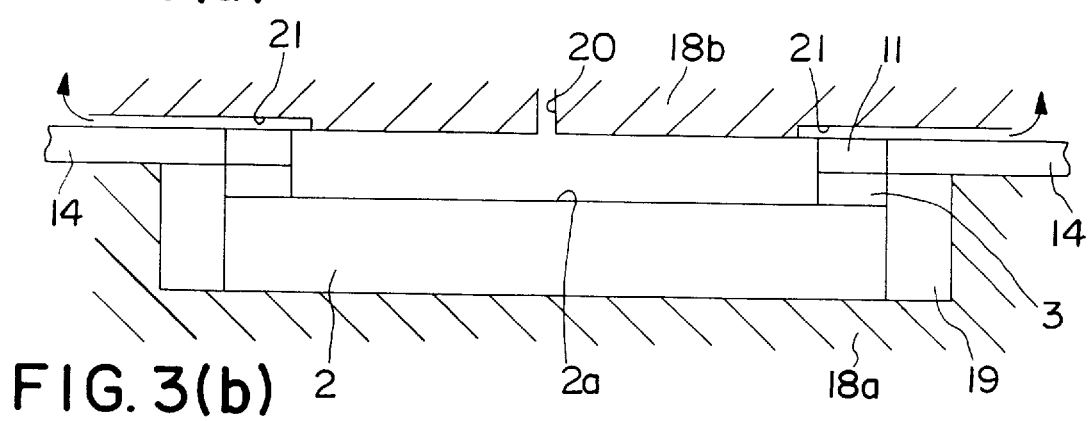
FIG. 3(b) is a fragmentary cross-sectional side view showing a side as seen in the direction indicated by arrow B in FIG. 1(b)

Next, the leads 6 fixed onto the semiconductor element 2 and the semiconductor element 2 are connected to each other by the metal wires 5, followed by introduction into a cavity 19 defined in a mold 18 as shown in FIGS. 3(a) and 3(b). Incidentally, FIG. 3(a) shows the side of the semiconductor device 10 as seen in the direction indicated by arrow A in FIG. 1(b). FIG. 3(b) illustrates the side of the semiconductor device 10 as seen in the direction indicated by arrow B in FIG. 1(b).

As the mold 18, one is used in which the depth of the cavity 19 defined in a cavity-retainer plate or lower form 18a is equal to the total thickness of the semiconductor element 2, adhesive tape 3 and dambar 11. Thus, the mold 18 is held within the cavity 19 in a state in which the bottom face (corresponding to the surface opposite to the circuit forming surface) of the semiconductor element 2 and the upper surfaces of the dambar 11 and each lead 6 are interposed between the bottom face and top face (corresponding to the lower surface of an upper form 18b) that form the cavity 19. Further, the mold 18 has a resin injection hole 20 and degassing holes 21 (see FIG. 3(b)) defined in the upper form 18b thereof. Each of dambar supports 14 of the lead frame 12 is interposed between the degassing hole 21 and the upper surface of the lower form 18a.

A molding resin is charged into the cavity 19 through the resin injection hole 20 using the above-described mold 18 and hardened at molding temperatures ranging from about 170° C. to 180° C. At this time, the central portion of the circuit forming surface 2a of the semiconductor element 2 is filled with the resin as shown in FIG. 3(a). In doing so, the dambar 11 is shaped in frame form and the upper surface of the dambar 11 is brought into contact with the upper form 18b. Therefore, the filled resin is dammed by the dambar 11 and is hence overflowed toward the outside thereof. As a result, no resin flows into the side and bottom face of the semiconductor element 2. Owing to the discharge of air in the cavity 19 from the degassing holes 21 during the resin filling, the molding resin is smoothly charged into the cavity 19. Thus, as shown in FIG. 1(b), the above-described resin charging allows only the upper surface of the dambar 11 and the upper surfaces of the upper sides 6b of the leads 6 to be exposed and permits the circuit forming surface 2a other than those to be sealed. Further, the semiconductor element 2 can be sealed with the molding resin in a state in which other surfaces except for the circuit forming surface 2a are exposed.

Figure 4A:
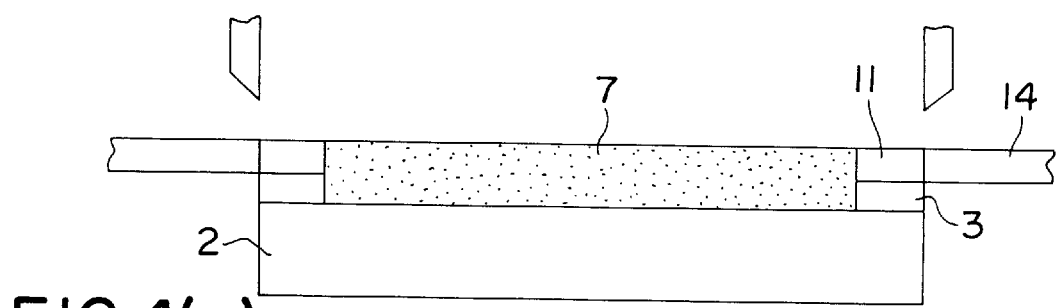
FIG. 4(a) is a side view showing a state before the cutting of dambar supports.
Figure 4B:
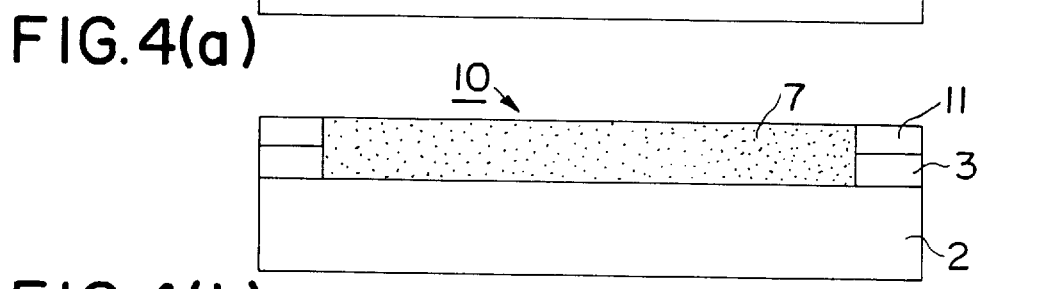
FIG. 4(b) is a side view showing a state after the cutting of the dambar supports.

Thereafter, the semiconductor element 2 sealed with the molding resin is taken out from the mold 18. Further, the dambar supports 14 each coupled to the dambar 11 are cut as shown in FIG. 4(a) and the dambar 11 is separated from the lead frame member 13 as shown in FIG. 4(b) thereby to obtain a semiconductor device 10.

Since the molding resin 7 seals the circuit forming surface 2a alone without covering the upper surfaces of the leads 6 and allows the surfaces other than the circuit forming surface 2a to be exposed, the entire thickness of the thus-obtained semiconductor device 10 reaches a thickness obtained by simply adding the thicknesses of the adhesive tape 3 and the dambar 11 (or each lead 6) to the thickness of the semiconductor element 2, thus resulting in a sufficiently thin thickness. Further, since the leads 6 are disposed on and inside the perimeter of the circuit forming surface 2a of the semiconductor element 2, the implementation or packing area of the semiconductor device 10 substantially coincides with the bottom area of the semiconductor element 2. As a result, its substantial packing area becomes much smaller than ever. Thus, since the semiconductor device 10 is so thin in thickness and very small in packing area, it can be more densely packaged or implemented on a printed board.

According to the method of manufacturing the semiconductor device 10, since the lead frame body 15 is composed of the dambar 11 identical in outer configuration or shape to the semiconductor element 2 and the leads 6 are connected to the dambar 11 via the adhesive tape 3 without causing electrical conduction, the molding resin can be charged into the cavity 19 so that the flow of the molding resin is dammed by the dambar 11, thereby making it possible to easily manufacture the semiconductor device 10.

Further, the upper surface of the dambar 11 and the bottom face of the semiconductor element 2 are interposed between the lower surface of the upper form 18b and the bottom face of the cavity 19 of the lower form 18a, and the resin is charged into the cavity 19 in this condition. Thus, since the charged resin is dammed by the dambar 11, the cavity 19 is not subjected to other restrictions if its size extending in the plane direction is larger than that of the semiconductor element 2. Accordingly, even if semiconductor elements different in size from each other are used, the mold 18 can be shared between the semiconductor elements if their thicknesses are identical to each other.

Figure 5A:
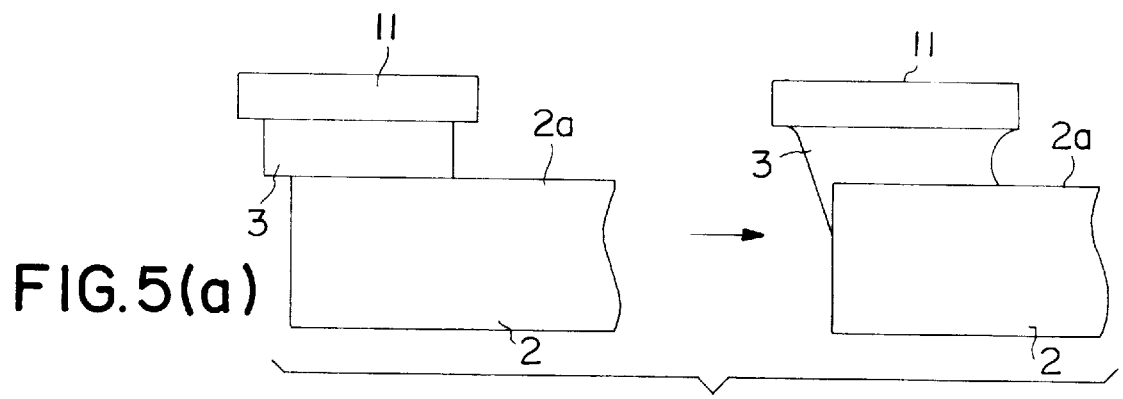
FIG. 5(a) is a view for describing a first modification of the manufacturing method shown in FIGS. 2 through 4, and FIGS. 5(b), 5(c) and 5(d) respectively reference views for describing the operation of the first modification.

FIG. 5(a) is a view for explaining a first modification of the manufacturing method described by reference to FIGS. 2 through 4. The first modification will be described with reference to FIG. 5(a).

The first modification is different from the manufacturing method shown in FIGS. 2 through 4 in that each lead frame body of a lead frame to be used slightly differs from the above-described lead frame body 15.

Namely, as the lead frame body employed in the first modification, one is used in which, as shown in FIG. 5(a), the outside dimension of an adhesive tape 3 is formed so as to be slightly larger than that of a circuit forming surface 2a of a semiconductor element 2 and the outside diameter of a dambar 11 is formed so as to be slightly larger than that of the adhesive tape 3.

Using such a lead frame body, the adhesive tape 3 is bonded to the circuit forming surface 2a in the same manner as the above embodiment in such a manner that the outer edge of the adhesive tape 3 substantially coincides with the outer edge of the circuit forming surface 2a. Subsequently, respective process steps are executed in the same manner as the above-described embodiment.

Thus, when the adhesive tape 3 is bonded onto the circuit forming surface 2a by thermo compression bonding, the outer edge of the adhesive tape 3 is partly melted upon thermo compression bonding as shown in FIG. 5(a). As a result, the melted portion exudes or oozes so as to cover a portion of the side of the semiconductor element 2 as well as to cover even a portion of the outer edge of the lower surface of the dambar 11.

Thus, according to the above-described manufacturing method, the resultant semiconductor device (not shown) is constructed in such a manner that the adhesive tape 3 is bonded to the lower surface of the dambar 11 in a wider area at the side portion of the semiconductor device and the adhesive tape 3 is also bonded to the semiconductor element 2 so as to extend to a side upper portion thereof as well as to the circuit forming surface 2a. It is thus possible to prevent impurities from externally entering the surface of the semiconductor element 2.

Figure 5B:
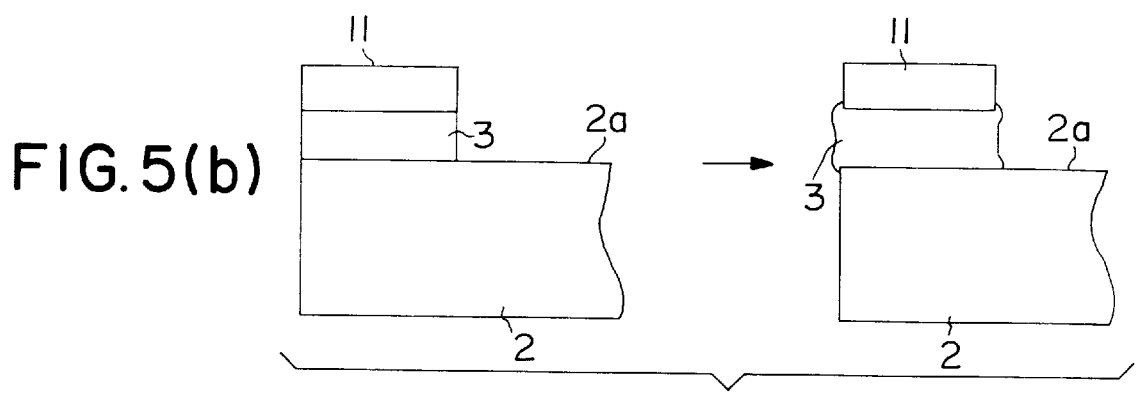

The state of the adhesive tape 3 subjected to the thermo compression bonding, of the semiconductor device 10 obtained by the manufacturing method shown in FIGS. 2 through 4 will be described for reference purposes with reference to FIG. 5(b). Since the adhesive tape 3 and the dambar 11 are both substantially identical in size to a circuit element surface 2a of a semiconductor element 2 in the present example, the oozing of the adhesive tape 3 due to its melting is less extensive so that the area for covering the side of the semiconductor element 2 is only slight.

Figure 5C:
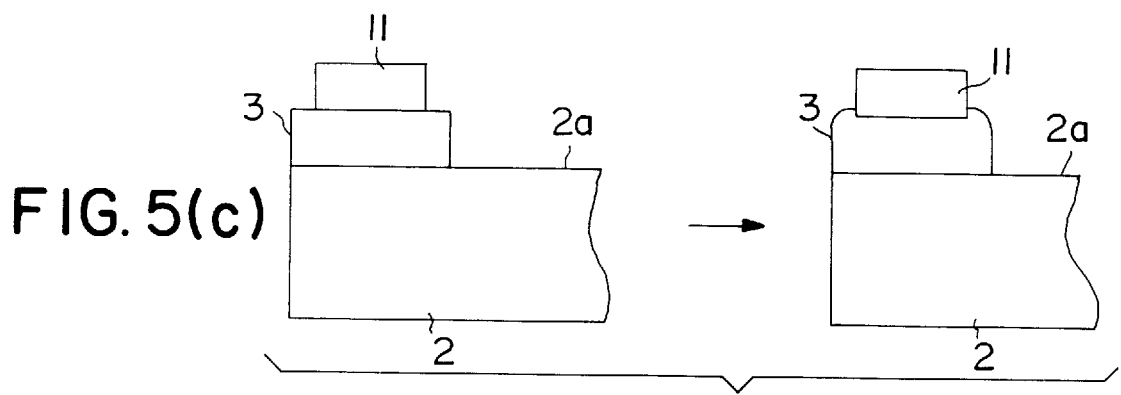

If an adhesive tape 3 is substantially identical in size to a circuit element surface 2a and a dambar 11 is smaller than the circuit element surface 2a as shown in FIG. 5(c), then the oozing of the adhesive tape 3 due to its melting occurs in the direction in which the adhesive tape 3 covers the side of the dambar 11.

Figure 5D:
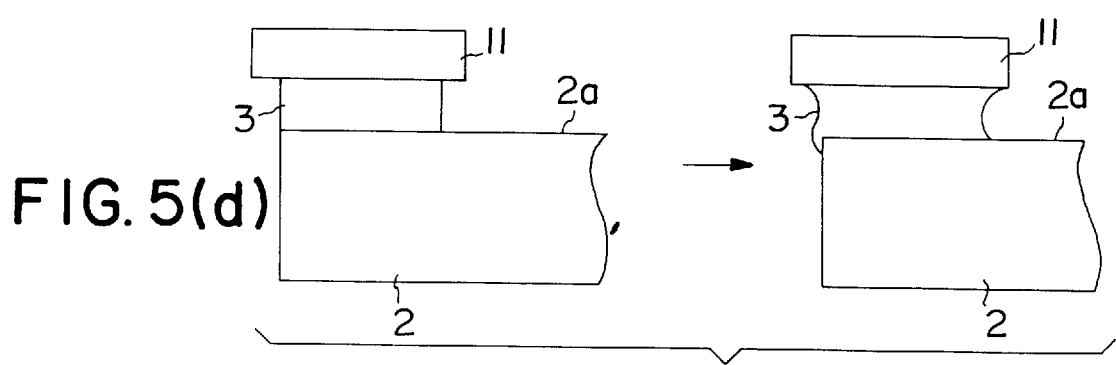

If an adhesive tape 3 is substantially identical in size to a circuit element surface 2a and a dambar 11 is larger than the circuit element surface 2a as shown in FIG. 5(d), then the oozing of the adhesive tape 3 due to its melting occurs in the direction in which the adhesive tape 3 covers the side of the semiconductor element 2 and the lower surface of the dambar 11. However, since the adhesive tape 3 is substantially identical in size to the circuit element surface 2a, the amount of oozing of the adhesive tape 3 due to its melting becomes smaller than that in FIG. 5(a).

Figure 6A:
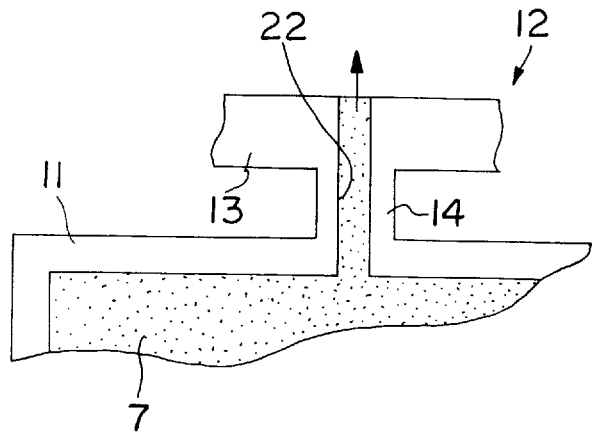
FIG. 6(a) is a fragmentary plan view of a lead frame.
Figure 6B:
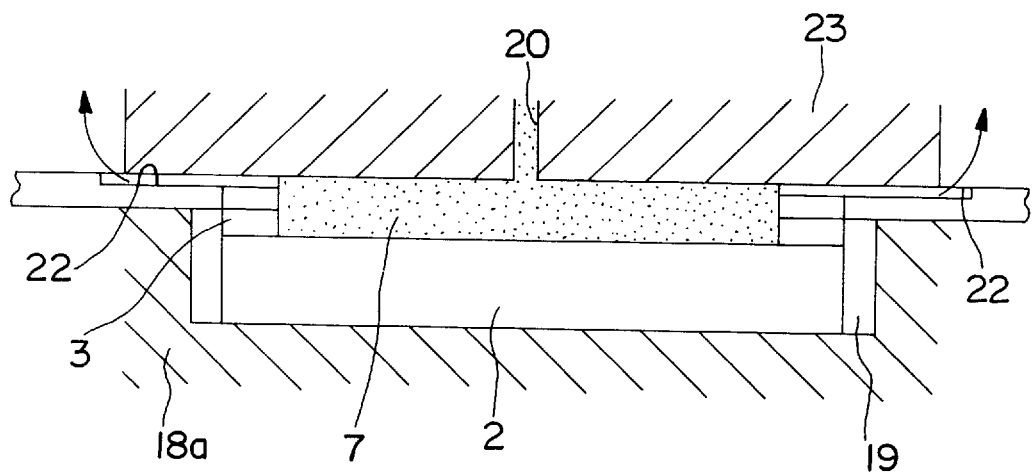
FIG. 6(b) is a fragmentary cross-sectional side view for describing a resin sealing process.

FIGS. 6(a) and 6(b) are respectively views for describing a second modification of the manufacturing method described with reference to FIGS. 2 through 4. The second modification will be described with reference to FIGS. 6(a) and 6(b).

The second modification is different principally from the manufacturing method shown in FIGS. 2 through 4 in that each of grooves 22 used for degassing upon resin filling and hardening is defined in a dambar support 14 and a dambar 11 of a lead frame 12 to be used.

Namely, as the lead frame 12 employed in the second modification, one is prepared in which as shown in FIG. 6(a), the groove 22 extending from the inner edge of the dambar 11 to the outer edge of a lead frame member 13 through the dambar support 14 is formed as shown in FIG. 6(a). The groove 22 serves as a hole used for degassing upon resin filling and hardening as will be described later. Further, the groove 22 is defined in the lead frame 12 so as to be located on the side opposite to the side of bonding of the adhesive tape 3.

In order to fabricate a semiconductor device, using the lead frame 12 having such grooves 22 define therein, an upper form 23 different from the upper form 18b of the mold 18 shown in FIG. 3(b) and having no degassing grooves 21 can be used as illustrated in FIG. 6(b). Namely, the lead frame 12 having the grooves 22 defined therein is used and provided so that each groove 22 extends from within a cavity 19 to the outside of the upper form 23. Owing to the provision of the lead frame 12, air in the cavity 19 is discharged through the grooves 22 upon resin filling, whereby a molding resin 7 can be smoothly charged into the cavity 19.

Thus, according to the manufacturing method, the upper form 23 used for the sealing of the molding resin can eliminate the need for its processing except for the provision of the resin injection hole 20. Accordingly, the manufacturing cost can be reduced and the upper form 23 can be made full of the sharing that less limitations are placed on the size of the semiconductor element 2.

Figure 7A:
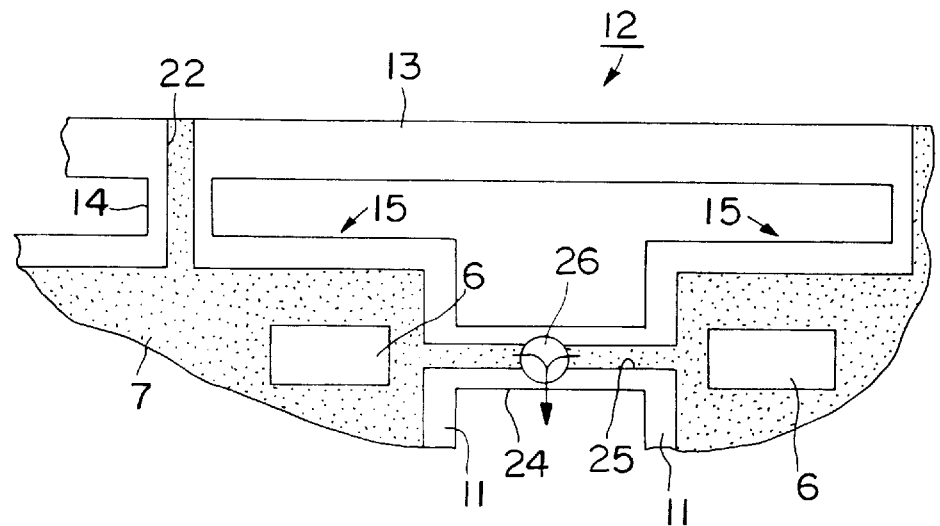
FIG. 7(a) is a fragmentary plan view of a lead frame.
Figure 7B:
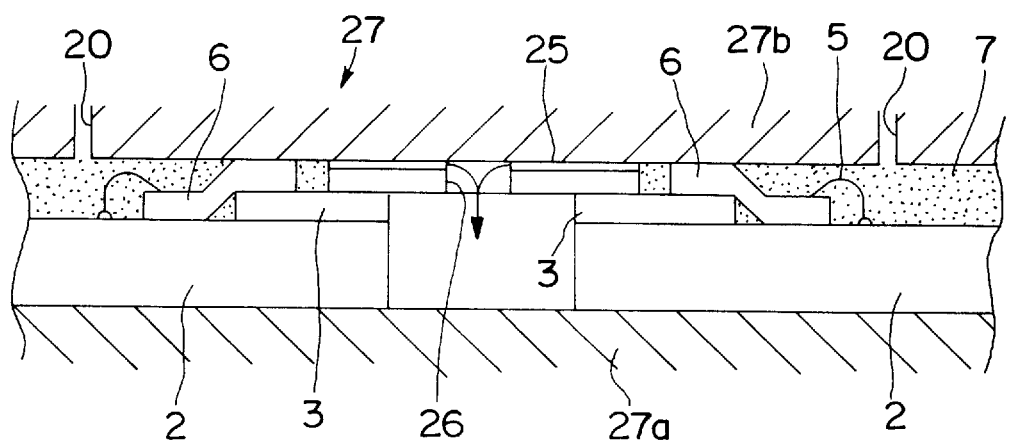
FIG. 7(b) is a fragmentary cross-sectional side view for describing a resin sealing process.

FIGS. 7(a) and 7(b) are respectively views for describing a third modification of the manufacturing method described with reference to FIGS. 2 through 4. The third modification will be described with reference to FIGS. 7(a) and 7(b).

The third modification is different principally from the second modification shown in FIGS. 6(a) and 6(b) in that as a lead frame 12, one is used in which grooves 22 are defined in a dambar support 14, a dambar-to-dambar lead 24 is provided between lead frame bodies 15 and 15, and a groove 25 and a hole 26 serving as degassing holes are defined in the dambar-to-dambar lead 24 as shown in FIG. 7(a).

Namely, as the lead frame 12 employed in the third modification as shown in FIG. 7(a), one is prepared in which the grooves 25 each extending from the inner edge of one dambar 11 to the inner edge of the other dambar 11 through the dambar-to-dambar lead 24 are defined in the lead frame bodies 15 and 15 and the dambar-to-dambar lead 24 provided therebetween, i.e., the surface opposite to the bonding surface of an adhesive tape 3, and each hole 26 extending through the bonding surface of the adhesive tape 3 from the groove 25 is defined in the dambar-to-dambar lead 24.

In order to fabricate a semiconductor device, using the lead frame 12 having the grooves 22 and 25 and the hole 26 defined therein, a mold 27 is used in which as shown in FIG. 7(b), the degassing grooves 21 are not provided in the same manner as the upper form 23 of the mold shown in FIG. 6(b) and resin sealing is simultaneously performed on a plurality of semiconductor elements, using a wide cavity. Namely, the mold 27 has an upper form 27b having a plurality of resin injection holes 20 defined therein. A resin is simultaneously injected through the resin injection holes 20 as shown in FIG. 7(b) upon resin filling.

When the resin is injected in this way, air inside the dambar 11 is squeezed out by the resin and some is discharged outside the mold 27 through the grooves 22. Simultaneously, the remaining air passes through the grooves 25 and flows between the semiconductor elements 2 and 2 through the hole 26 being in communication with each groove 25. Accordingly, the manufacturing method can also provide smooth filling of the molding resin 7. Further, the manufacturing method is also superior to the manufacturing method shown in FIGS. 6(a) and 6(b) in that since air flows between the dambars 11 and 11, air bleeding or ventilation can be made smoother and a reduction in resin filling characteristic can be sufficiently suppressed owing to the formation of the path for discharging air from the inside of the dambar 11 to the outside of each semiconductor element 2 even if the efficiency of air extraction or ventilation is reduced due to a complex configuration of the lead frame 12. Further, the plurality of semiconductor elements 2 can be resin-sealed simultaneously by one mold 27 and hence the fabrication cost of the mold can be made cheap and the manufacturing cost thereof can be reduced.

Figure 8A:
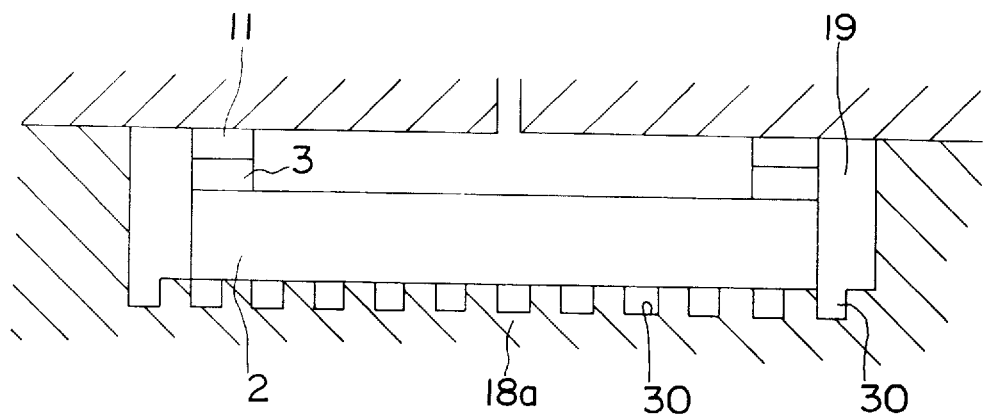
FIG. 8(a) is a cross-sectional side view for describing a mold to be used.

FIG. 8(a) is a view for describing a fourth modification of the manufacturing method described with reference to FIGS. 2 through 4.

The fourth modification is different from the manufacturing method shown in FIGS. 2 through 4 in that as a mold to be used, one is used in which grooves are defined in the bottom face for forming a cavity thereof.

Figure 8B:
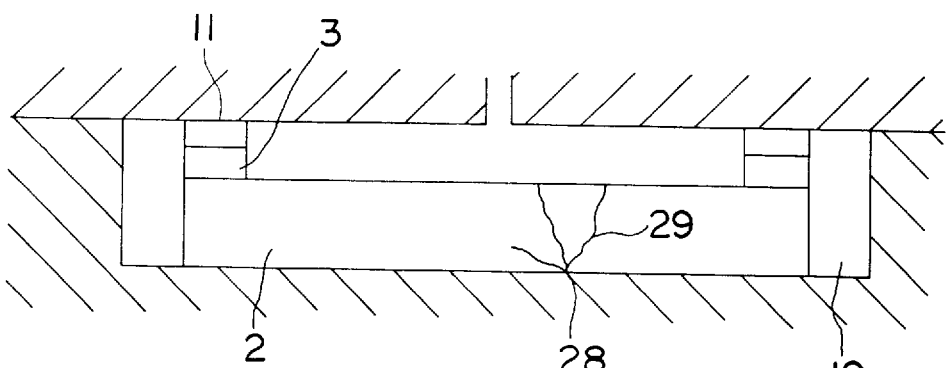
FIG. 8(b) is a reference view for describing the operation of the fourth modification.

Namely, for example, the manufacturing method shown in FIGS. 2 through 4 has a problem in that when a foreign material 28 exists within a cavity 19 as shown in FIG. 8(b), the foreign material 28 will cause damage to a semiconductor element 2 because the semiconductor element 2 and the lead frame 12 placed thereon are interposed between the bottom face for forming the cavity 19, of the lower form 18a of the mold 18 shown in FIG. 3(a) and the lower surface of the upper form 18b thereof. Particularly when its damage is serious, cracks 29 are produced, so that the semiconductor device is impaired.

Thus, in the fourth modification, grooves 30 are defined in the bottom face of the lower form 18a, for forming the cavity 19 as shown in FIG. 8(a) to reduce the probability that each semiconductor element 2 will be damaged by the foreign material 28, even if the foreign material 28 exists. The formation of the grooves 30 in the bottom face has no effect on the semiconductor element 2 and can provide smooth resin filling if the foreign material 28 falls within the corresponding groove 30 even if the foreign material 28 remains within the cavity 19 upon resin filling.

In the fourth embodiment, the grooves 30 are defined in the bottom face of the cavity 19. However, even if simple recesses or concave portions are defined in place of the grooves, the influence of the foreign material 28 can be made small.

Figure 9A:
FIG. 9(a) is a fragmentary cross-sectional side view of a mold to be used.

FIG. 9(a) is a view for describing a fifth modification of the manufacturing method described with reference to FIGS. 2 through 4.

The fifth modification is different from the fourth embodiment in that the bottom face of each groove defined in the bottom face of a cavity 19 is formed by a downwardly-expanded curved surface.

Namely, in the fifth modification, grooves 31 defined in the bottom face of the cavity 19 are shaped in the form of semicircles as seen in the transverse cross-section as shown in FIG. 9(a) and hence the bottom faces thereof are formed as curved surfaces expanded downwards in the form of the semicircles.

Figure 9B:
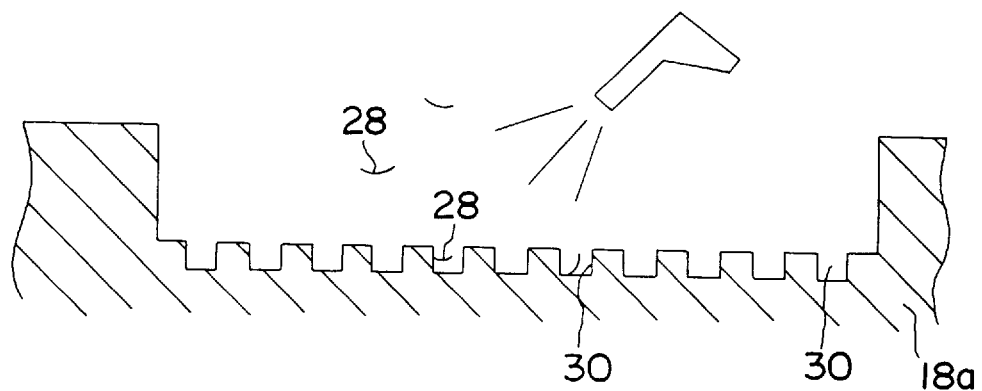
FIG. 9(b) is a reference view for explaining the operation of the fifth modification.

In the fourth modification, a bit of foreign material 28 may remain within a groove 30 due to the shape of the groove 30 even if air is blown against the foreign material 28 by an air gun with a view toward removing the foreign material 28 as shown in FIG. 9(b). In the fifth modification, however, the foreign material 28 can be easily removed because each groove 31 has a curved shape. Thus, the time required to remove the foreign materials is shortened and correspondingly the time necessary for the execution of the process steps can be reduced. Further, the occurrence of damage to the semiconductor element 2 by the foreign materials can be curbed.

In the fifth modification, the grooves 31 have been defined in the bottom face of the cavity 19. However, concave portions may be simply defined in place of the grooves in the same manner as the fourth modification. If the concave portions have concave surfaces respectively formed by curved surfaces expanded downwardly of the bottom face of the cavity 19 in this case, then the influence of the foreign materials 28 can be reduced.

Figure 10A:
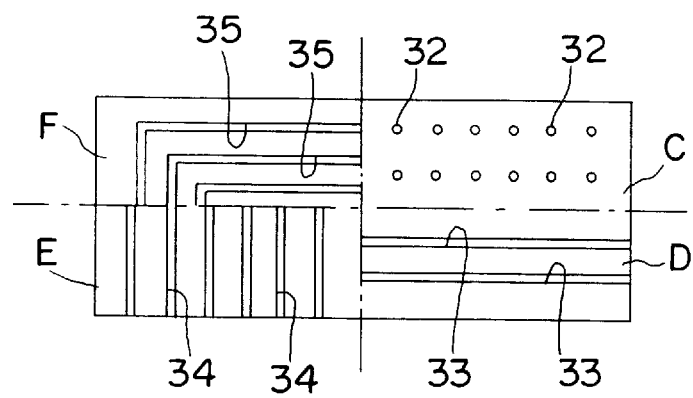
FIG. 10 illustrates a sixth modification of the manufacturing method shown in FIGS. 2 through 4, wherein FIG.
FIG. 10(b) is a reference view for explaining the operation of the sixth modification.

FIG. 10(a) is a view for describing a sixth modification of the manufacturing method described with reference to FIGS. 2 through 4.

The sixth modification is different from the fourth modification in that grooves or concave portions defined in the bottom face of a cavity 19 are respectively symmetrically formed or disposed in their upward and downward directions and their right and left directions in terms of the shape of the bottom face as seen in the plane thereof.

Namely, in the sixth modification as shown in FIG. 10(a), concave portions or grooves indicated by C, D, E and F in FIG. 10(a) are defined in the bottom face 19a of the cavity 19. Here, C, D, E and F respectively indicate further first, second, third and fourth examples of the sixth modification. In the examples, the illustration of the entire bottom faces 19a thereof is omitted and only parts of the faces divided into four are illustrated.

The structure indicated by C in FIG. 10(a) is one in which concave portions 32 that are circular as seen in the plane are formed and arranged at equal intervals in the vertical and horizontal directions. The structure indicated by D in FIG. 10(a) is one in which a plurality of grooves 33 extending in the horizontal direction as seen in the drawing are formed and arranged in parallel and at equal intervals. Further, the structure indicated by E in FIG. 10(a) is one in which a plurality of grooves 34 extending in the vertical direction as seen in the drawing are formed and arranged in parallel and at equal intervals. The structure indicated by F in FIG. 10(a) is one in which a plurality of grooves 35 that are rectangular and frame-shaped as seen in the plane are formed and arranged concentrically and at equal intervals.

Figure 10B:
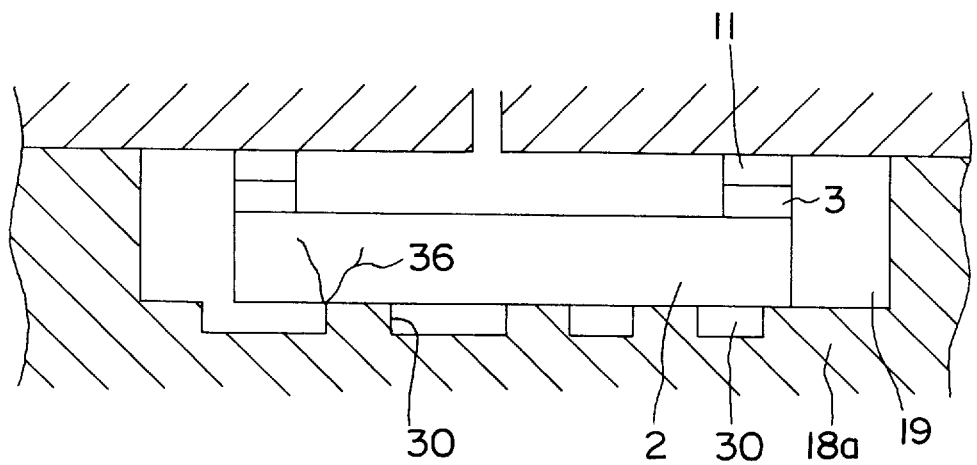

Meanwhile, the fourth modification has a possibility that when the semiconductor element 2 is placed within the mold and clamped where the grooves 30 are asymmetrically disposed as seen in the plane as shown in FIG. 10(b), the back of the semiconductor element 2 will strike against the corner of each groove 30 if the semiconductor element 2 has a slight inclination, whereby the force is concentrated on the corner thereof to thereby produce cracks 36.

However, since the grooves defined in the mold, which make contact with the back of the semiconductor element 2, are arranged symmetrically with respect to the back of the semiconductor element 2 in the case of the vertically and horizontally-symmetrical structures as indicated by C, D, E and F, the bottom surface of the cavity 19 is uniformly brought into contact with the back of the semiconductor element 2 upon placement of the semiconductor element 2 within the mold. Thus, no inclination is produced in the semiconductor element 2 and no damage occurs in the back of the semiconductor element 2 upon its clamping.

Even in the case of the sixth modification, the concave surfaces of the grooves 33, 34 and 35 defined in the bottom face of the cavity 19 may be formed by curved surfaces expanded downwardly of the bottom face of the cavity 19.

Figure 11A:
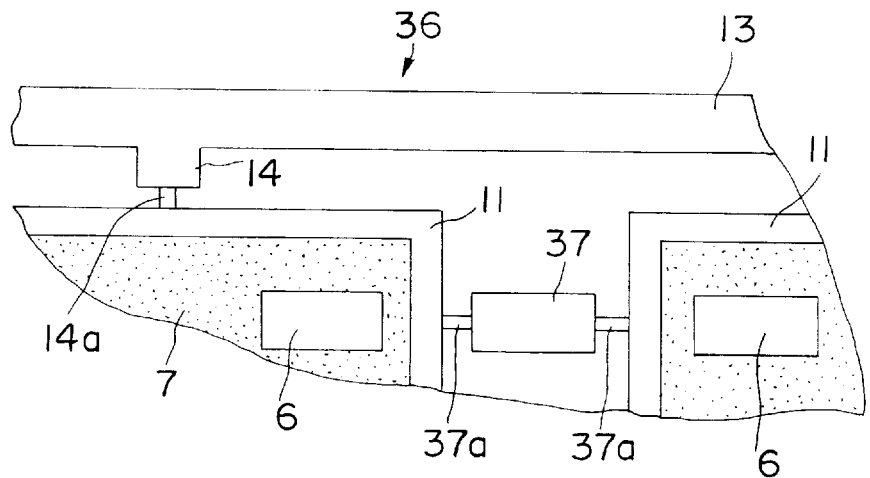
FIG. 11(a) is a fragmentary plan view of a prepared lead frame.
Figure 11B:
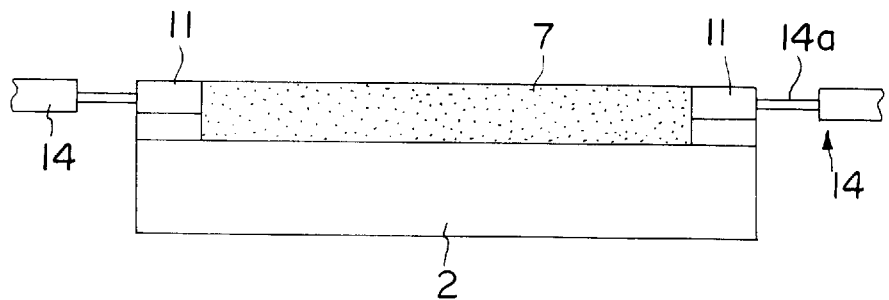
FIG. 11(b) is a cross-sectional side view for explaining a manufacturing process.

FIGS. 11(a) and 11(b) are respectively views for describing a seventh modification of the manufacturing method described with reference to FIGS. 2 through 4. Incidentally, FIGS. 11(a) and 11(b) respectively illustrate a state of the present modification after a lead frame has been provided on a semiconductor element 2 and a resin has been charged.

The seventh modification is different principally from the manufacturing method shown in FIGS. 2 through 4 in that portions thinner than a dambar in thickness are respectively provided at dambar supports of a lead frame to be used.

Namely, in the seventh modification as shown in FIGS. 11(a) and 11(b), a used lead frame 36 is different from the lead frame 12 shown in FIG. 7(a) by way of example and thin-walled portions 14a are attached to their corresponding dambar supports 14. Each thin-walled portion 14a is provided at a portion provided in continuous with the dambar 11. Each dambar support 14 corresponding to a portion continuously connected to the thin-walled portion 14a is formed in the same thickness as that of the dambar 11.

Since the thin-walled portion 14a is attached to each dambar support 14 in the above-described manner, each dambar support 14 is easy to cut at the thin-walled portion 14a as a matter of course, so that a lead frame body 15 becomes easy to be detached from a lead frame member 13. Thus, in the seventh modification, the lead frame 36 has dambar-to-dambar leads 37 each formed between the dambars 11 and 11 existing between the lead frame bodies 15 and 15 as shown in FIG. 11(a) in order to prevent each lead frame body 15 from being unexpectedly detached from the lead frame member 13 as described above. Even in the case of the dambar-to-dambar lead 37, thin-walled portions 37a and 37a are attached to their corresponding portions continuously connected to the dambars 11 so as to make it easy to cut the dambar-to-dambar lead 37.

Figure 11C:
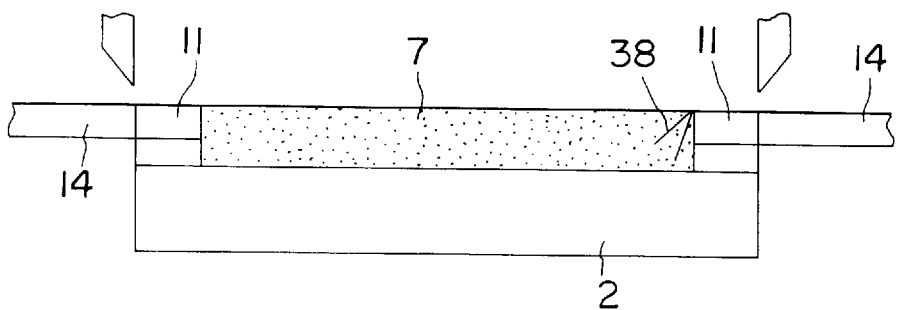
FIG. 11(c) is a reference view for explaining the operation of the seventh modification.

After the completion of the resin filling as shown in FIGS. 11(a) and 11(b), the unnecessary dambar supports 14 are cut as shown in FIG. 4(a) to divide semiconductor devices into pieces as the final process step. At this time, there is a fear of the occurrence of cracks 38 in the molding resin 7 as illustrated in FIG. 11(c). This may occur if each dambar support 14 is thick and hard to cut.

However, since the thin-walled portions 14a are respectively attached to the dambar supports 14 as shown in FIGS. 11(a) and 11(b), the seventh modification prevents the occurrence of the cracks 38 referred to above owing to the cutting of the thin-walled portions 14a. Further, since the thin-walled portions 37a and 37a are attached to the dambar-to-dambar lead 37 in the same manner as described above, a dambar-to-dambar lead 37 is easy to cut, whereby the cracks 38 are prevented from occurring even when the dambar-to-dambar lead 37 is cut.

Figure 12A:
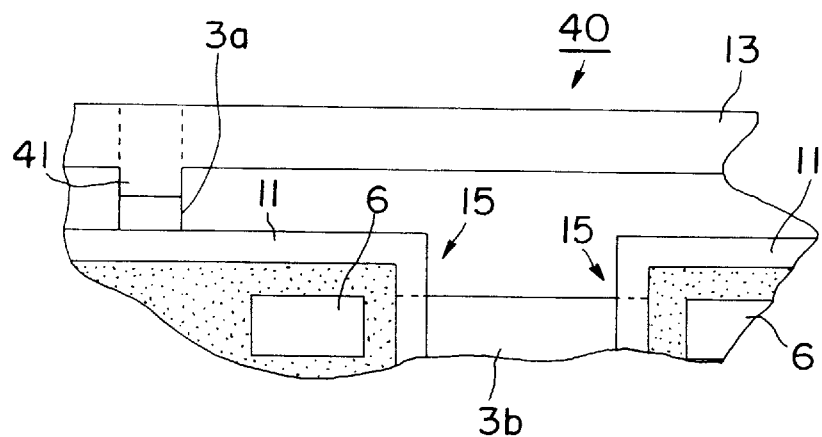
FIG. 12(a) is a fragmentary plan view of a prepared lead frame.
Figure 12B:
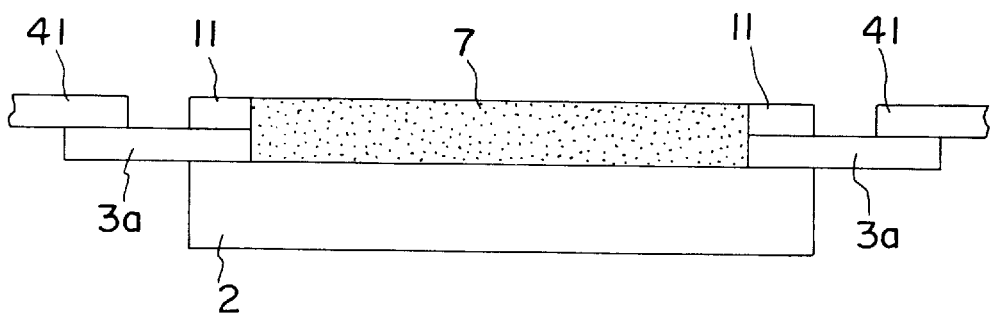
FIG. 12(b) is a cross-sectional side view for explaining a manufacturing process.

FIGS. 12(a) and 12(b) are respectively views for explaining an eighth modification of the manufacturing method described with reference to FIGS. 2 through 4. Incidentally, FIGS. 12(a) and 12(b) respectively illustrate a state of the present modification after a lead frame has been provided on a semiconductor element 2 and a resin has been charged.

The eighth modification is different from the seventh modification shown in FIGS. 11(a) and 11(b) in that as a lead frame to be used, one is used in which adhesive tapes are provided in place of the thin-walled portion 14a of each dambar support 14 and the dambar-to-dambar lead 37.

Namely, in the eighth modification, the lead frame 40 used as shown in FIGS. 12(a) and 12(b) is one having a structure in which dambar supports 41 extending outwardly from dambars 11 of lead frame bodies 15 are respectively provided at intervals away from the dambars 11 and connected thereto through an adhesive tape 3a. Even in the case of the lead frame 40, the lead frame bodies 15 and 15 are similarly coupled to each other with an adhesive tape 3b to reinforce the connection between the lead frame bodies 15 and a lead frame member 13. Here, the adhesive tapes 3a and 3b are ones formed by extending the adhesive tape 3 for coupling the dambar 11 and the leads 6 to each other by required portions in advance.

Thus, according to the eighth modification, the thin and soft adhesive tapes 3a and 3b are cut when the dambar supports 41 are cut and the dambars 11 and 11 are cut away from each other in order to divide semiconductor devices into pieces after the completion of resin filling. As a result, the degree of an under-cutting load on a molding resin 7 can be extremely reduced, thereby making it possible to reliably prevent the cracks 38 shown in FIG. 11(c) from occurring. When the thin-walled portions 14a of the dambar supports 14 and the thin-wall portions 37a of the dambar-to-dambar leads 37 are cut, some of the thin-walled portions 14a and 37a remain in projection form as portions left behind by their cutting in the seventh modification shown in FIGS. 11(a) and 11(b). As a result, there is a possibility that the remaining portions will impair the outer appearance of each semiconductor device and interfere with the implementation of the semiconductor device on a printed board due to the fact that the semiconductor device makes contact with the adjacent semiconductor device upon its implementation. However, since the cut portions are the thin and soft adhesive tapes 3a and 3b in the eighth modification shown in FIGS. 12(a) and 12(b), problems are unlikely even if portions left are behind by cutting. Further, there is no possibility that the portions will interfere with an adjacent semiconductor device on the printed board, of the implementation of each semiconductor device on the printed board.

Figure 13A:
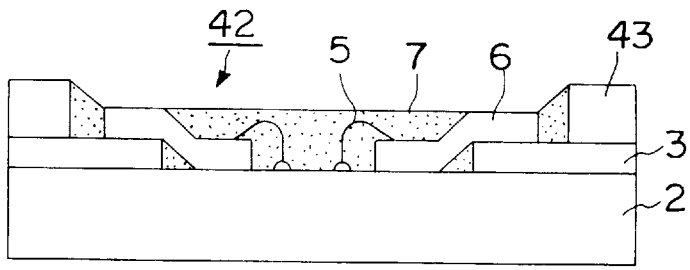
FIG. 13(a) is a cross-sectional side view of the modification.

FIG. 13(a) is a view showing a modification of the first embodiment shown in FIGS. 1(a) and 1(b). Reference numeral 42 in FIG. 13(a) indicates a semiconductor device.

The semiconductor device 42 is different from the semiconductor device 10 shown in FIGS. 1(a) and 1(b) in that a dambar 43 is formed much thicker than each of leads 6 in thickness.

Figure 13B:
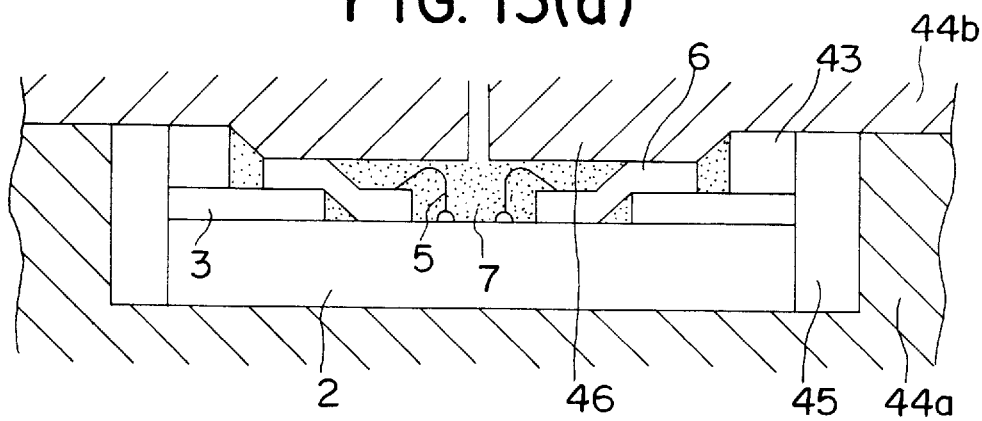
FIG. 13(b) is a fragmentary cross-sectional side view for explaining a resin sealing process.

In order to fabricate the semiconductor device 42, as a lead frame 12, one provided with the dambar 43 thicker than each lead 6 is prepared and may be processed subsequently in a manner similar to the manufacturing method shown in FIGS. 2 through 4. However, a mold to be used is different from the mold 18 shown in FIG. 3(a) in that, as shown in FIG. 13(b), the depth of a cavity 45 defined in a lower form 44a is deeper than that of the cavity 19 defined in the mold 18 shown in FIG. 3(a) by the difference between the thicknesses of the dambar 43 and the lead 6. Furthermore a projection 46 that protrudes by a distance corresponding to the difference between the thicknesses of the dambar 43 and the lead 6 is provided in the center of a lower surface of an upper form 44b.

Figure 13C:
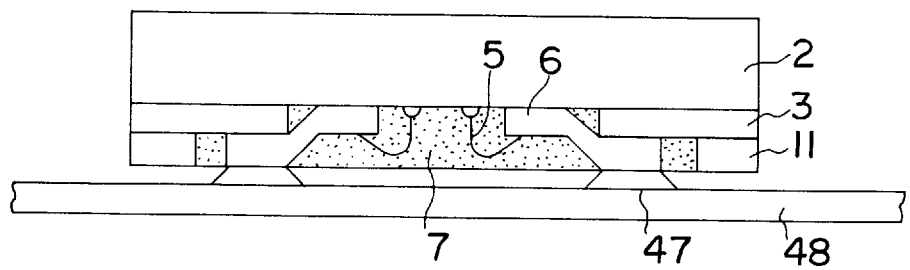
FIG. 13(c) is a reference view for explaining the operation of the modification.
Figure 13D:
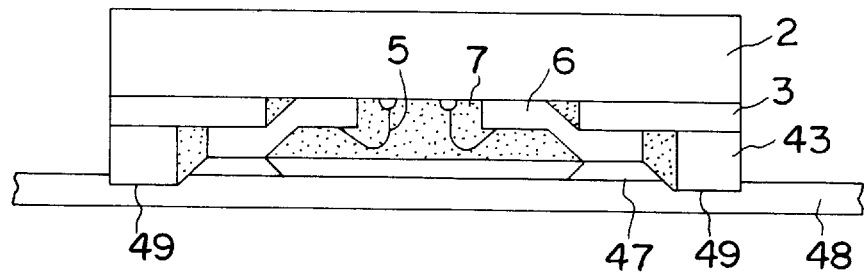
FIG. 13(d) is a fragmentary cross-sectional side view showing a state of implementation of the modification.

When the semiconductor device 10 shown in FIGS. 1(a) and 1(b) is implemented on a printed board, each lead 6 is electrically connected and fixed to a printed board 48 by solder 47 as shown in FIG. 13(c). However, since the entire configuration of the semiconductor device 10 is virtually made up of the semiconductor element 2, the thermal expansion coefficient thereof substantially coincides with about $3\times10^{-6}/°C$. corresponding to the thermal expansion coefficient of silicon. On the other hand, the thermal expansion coefficient of the printed board 48 is substantially identical to 2 to $3\times10^{-5}/°C$. corresponding to a thermal expansion coefficient of a resin. Thus, the thermal expansion coefficient of the printed board 48 is increased by one digit as compared with the semiconductor device 10.

However, since the thermal expansion coefficient of the printed board 48 is larger than that of the semiconductor device 10 in this way, a thermal stress produced due to the difference between the thermal expansion coefficients is concentrated on the solder 47 used as each junction between the printed board 48 and the semiconductor device 10 after the implementation of the semiconductor device 10 on the printed board 48. When the thermal stress increases, cracks are produced in the solder, so that there is a fear that they will result in a conductive failure. In order to prevent its occurrence, for example, a substrate composed of ceramic whose thermal expansion coefficient is close to that of the semiconductor element 2, may be used in place of the printed board 48. However, since the ceramic substrate is so expensive in this case, a great increase in cost will be incurred.

Thus, in order to solve such inconvenience, the semiconductor device 42 according to the present modification is constructed in such a manner that the dambar 43 is much thicker than each lead 6 in thickness-as shown in FIG. 13(a). When the semiconductor device 42 is implemented on the printed board 48, grooves 49 corresponding to the positions and configurations of the dambars 43 are defined in predetermined positions on the printed board 48 in advance. The dambars 43 of the semiconductor device 42 are respectively fitted in the grooves 49 of the printed board 48 as projections and are connected and fixed to the printed board 48 by the solder 47 in this condition.

In doing so, the thermal stress produced due to the difference between the thermal expansion coefficients is reduced by fitting the projections composed of the dambars 43 in their corresponding grooves 49 defined in the printed board 48, whereby cracks can be prevented from occurring in the solder 47.

Thus, when the semiconductor device 42 according to the present modification is constructed as a structure in which the semiconductor device 42 is implemented on the board, such a structure can prevent the cracks from occurring in the solder 47 used for fixing the semiconductor device 42. As a result, the electrical connections between the semiconductor device and the printed board by the solder 47 can be kept satisfactory.

Figure 14:
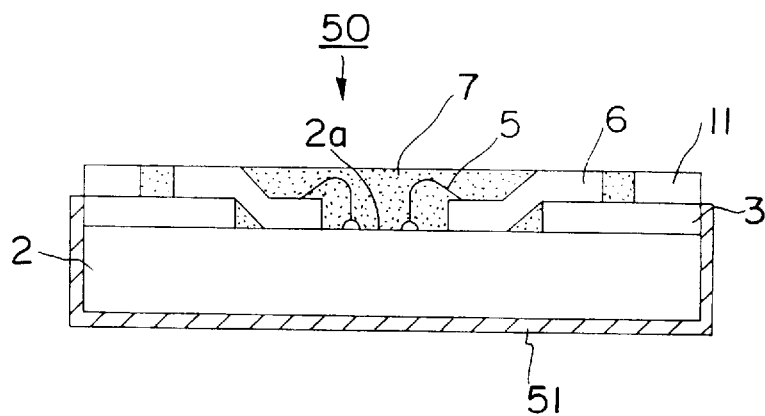
FIG. 14 is a cross-sectional side view schematically showing the configuration of a second embodiment of a plastic molded type semiconductor device of the present invention.

FIG. 14 is a view showing a second embodiment of the present invention. Reference numeral 50 in FIG. 14 indicates a semiconductor device.

The present semiconductor device 50 is different from the semiconductor device 10 shown in FIG. 1(a) and 1(b) in that surfaces of a semiconductor element 2, which are other than a circuit forming surface 2a thereof, are covered with a coating resin.

Namely, the semiconductor device 50 shown in FIG. 14 has surfaces, other than the circuit forming surface 2a and side end surfaces of an adhesive tape 3 placed on the circuit forming surface 2a, that are covered with a coating resin 51. The coating resin 51 is composed of, for example, an epoxy resin, a polyimide resin or the like and ranges from about 20 $\mu$m to 30 $\mu$m in thickness. The coating resin 51 is one coated so as to keep the size of the semiconductor device 50 itself almost constant.

Figure 15A:
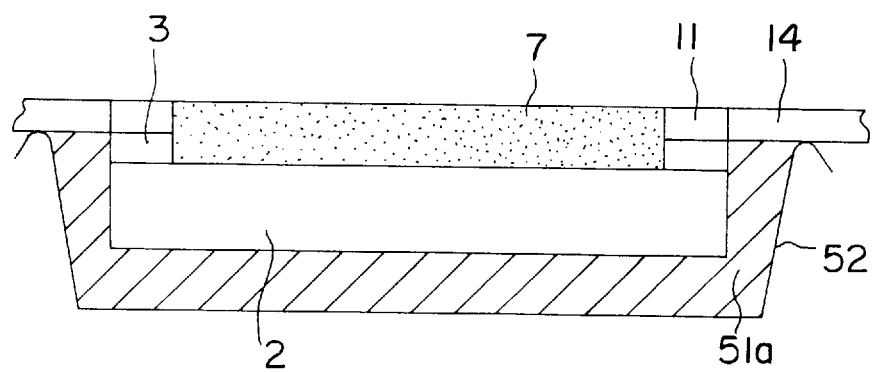
FIGS. 15(a) and 15(b) are respectively cross-sectional side views for describing resin coating processes in processing order.
Figure 15B:
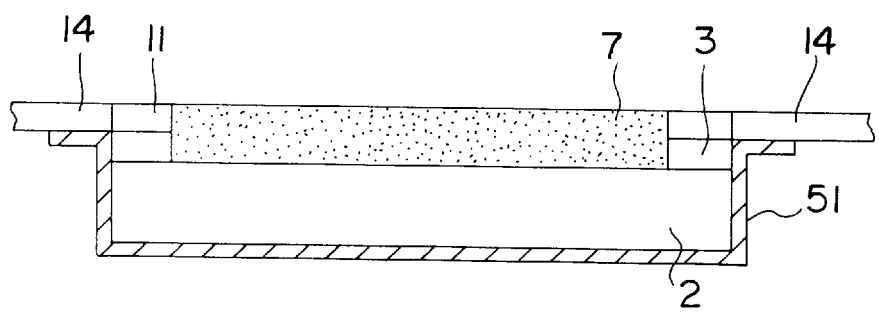

In order to fabricate the semiconductor device 50, a process up to a mold resin sealing step is executed in a manner similar to the manufacturing method shown in FIGS. 2 through 4. Thereafter, the resultant semiconductor device is subjected to resin sealing by immersing it into a resin tank 52 fully filled with a liquid resin 51a obtained by dissolving the coating resin 51 in a solvent, as shown in FIG. 15(a). At this time, the resin-sealed semiconductor device is kept in a state in which each dambar support 14 of a lead frame 12 is not being cut. The size of an opening of the resin tank 52 is set to a size in which the dambar supports 14 are suspended at the edges of the resin tank 52 when the semiconductor device is immersed into the resin tank 52. In this condition, the semiconductor element 2 side is immersed into the liquid resin 51a for a suitable time interval as mentioned above in the state in which the dambar supports 14 of the semiconductor device have been suspended at the edges of the resin tank 52. Next, the semiconductor device is pulled up from the resin tank 52 and the coating resin attached to the semiconductor device is dried and hardened at a temperature of about 100° C. for several hours as shown in FIG. 15(b). Thereafter, the dambar supports 14 are cut in a manner similar to the manufacturing method shown in FIGS. 2 through 4 to thereby obtain the semiconductor device 50 shown in FIG. 14.

In the semiconductor device 50 obtained in this way, the covering of the surfaces of the semiconductor element 2, other than the circuit forming surface 2a with the coating resin 51, makes it hard to scratch the surfaces upon handling of the semiconductor device 50, for example, and improves the resistance of the semiconductor device 50 to an impact. Namely, since the semiconductor element 2 is composed of a brittle material such as silicon or the like, large cracks may be produced if any flaws occur in the surfaces, so that the function of the semiconductor element 2 is apt to be impaired. However, the covering of the surfaces with the coating resin 51 can reduce an external impact so as to prevent the occurrence of the cracks. Further, since the boundary between the circuit forming surface 2a of the semiconductor element 2a and the back of the adhesive tape 3 is also covered with the coating resin 51 as shown in FIG. 14, the resistance of the semiconductor device to moisture can be also improved.

According to the method of manufacturing the semiconductor device 50, since the dambar supports 14 are suspended at the edges of the resin tank 52 fully filled with the liquid resin 51a and the lower side of each dambar support 14 is immersed into the liquid resin 51a before the cutting of the dambar supports 14, resin coating is extremely easy and the fabrication of the semiconductor device 50 does not need a special device. Further, the semiconductor device 50 can be fabricated easily and in full correspondence with its mass productivity.

Figure 16A:
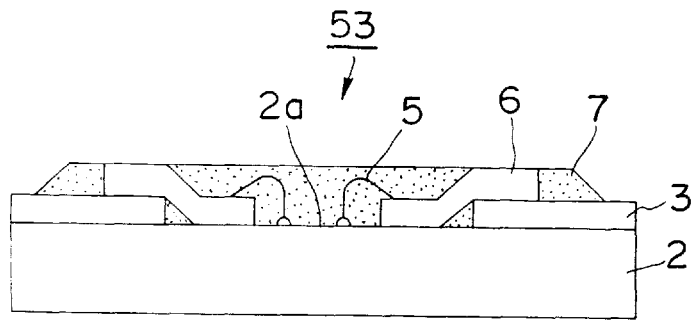
FIG. 16(a) is a cross-sectional side view schematically illustrating the configuration of the third embodiment.
Figure 16B:
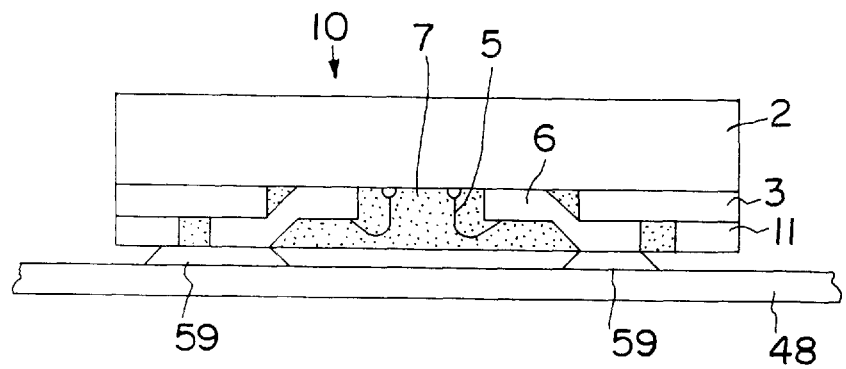
FIG. 16(b) is a reference view for explaining the operation of the third embodiment.

FIG. 16(a) is a view illustrating a third embodiment of the present invention. Reference numeral 53 in FIG. 16(a) indicates a semiconductor device.

The semiconductor device 53 is different from the semiconductor device 10 shown in FIGS. 1(a) and 1(b) in that no dambar 14 is provided.

Namely, the semiconductor device 53 shown in FIG. 16(a) comprises leads 6 provided on a circuit forming surface 2a of a semiconductor element 2 with an adhesive tape 3 interposed therebetween, and gold wires 5 for respectively electrically connecting these leads 6 to the semiconductor element 2. Further, the semiconductor device 53 is constructed such that the leads 6 and the gold wires 5 are sealed with a mold resin 7 in a state in which the upper surfaces of the leads 6 have been exposed.

Figure 17A:
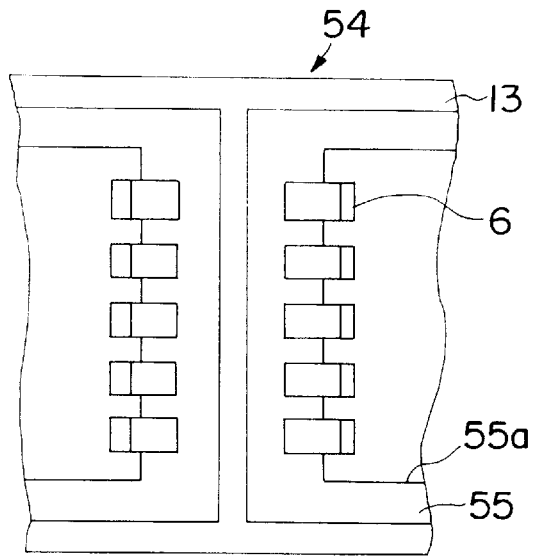
FIG. 17(a) is a fragmentary plan view schematically showing the configuration of a prepared lead frame.

In order to fabricate the semiconductor device 53, a lead frame 54 shown in FIG. 17(a) is first prepared. The lead frame 54 is one in which adhesive tapes 55 each having a rectangular opening 55a are bonded to a lead frame member 13 and parts of leads 6 are bonded and fixed to the adhesive tapes 55. Each lead frame body (not shown) is composed of the adhesive tape 55 and the leads. In the adhesive tape 55, the shape of each opening 55a defined therein is smaller than the outer shape of a circuit forming surface 2a of a semiconductor element 2. Further, the parts of the leads 6 are bonded to the inner edge of each opening 55a and the remaining parts thereof extend into the opening 55a.

Figure 17B:
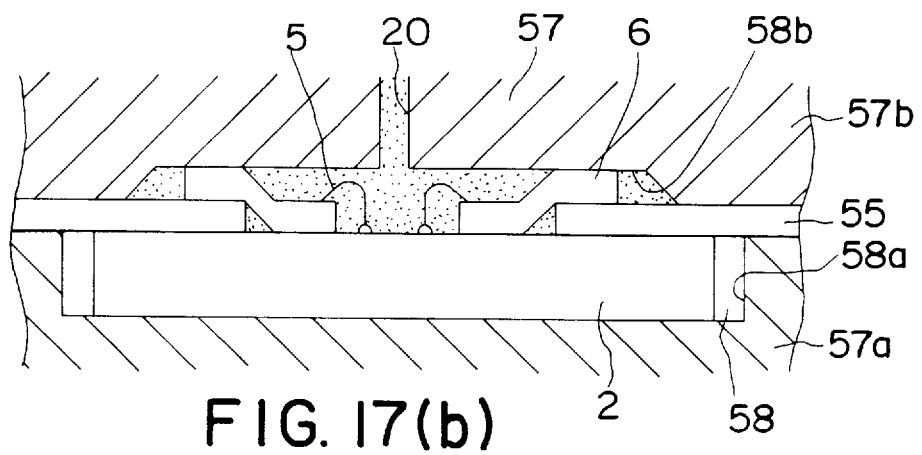
FIG. 17(b) is a fragmentary cross-sectional side view for explaining a resin sealing process.
Figure 17C:
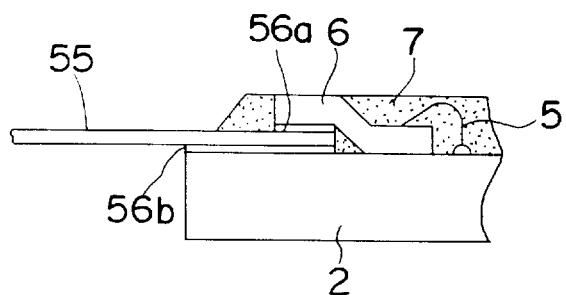
FIG. 17(c) is a fragmentary cross-sectional side view for describing the configuration of an adhesive tape employed in the prepared lead frame.

Here, the adhesive tape 55 is constructed as shown in FIG. 17(c). Namely, an adhesive layer 56a is formed on the surface of the adhesive tape 55 on the side of the bonding of each lead 6 to the adhesive tape 55 so as to extend from the inner edge thereof for defining the opening 55a to the position of bonding of each lead 6 to the adhesive tape 55. Further, an adhesive layer 56b is formed on the opposed surface of the adhesive tape 55 so as to extend from the inner edge thereof for defining the opening 55a to the position identical to that of the outer edge of the circuit forming surface 2a of the semiconductor element 2. Moreover, an adhesive layer (resin is not shown) is provided at the position of the surface of the adhesive tape 55 on the side of bonding of each lead 6 to the surface thereof, which position corresponds to the lead frame member 13, and no adhesive layer is formed at other locations.

Next, each lead frame body of the lead frame 54 is placed on the semiconductor element 2 in such a manner that the outer edge of the adhesive layer 56b on the adhesive tape 55 substantially coincides with the outer edge of the circuit forming surface 2a of the semiconductor element 2. Thereafter, the leads 6 are fixed onto the semiconductor element 2 by the adhesive tape 55.

Next, the leads 6 on the semiconductor element 2 are respectively connected to the circuit forming surface 2a of the semiconductor element 2 by the gold wires 5. Further, the semiconductor element 2 connected with the gold wires 5 is placed in a cavity 58 defined in a mold 57 as shown in FIG. 17(b). As the mold 57, one is used in which a recess or concave portion 58a having a depth equal to the thickness of the semiconductor element 2 is defined in a lower form 57a and an open concave portion 58b with a size smaller than the circuit forming surface 2a is defined in an upper form 57b.

The mold 57 referred to above is used and a mold resin is charged into the cavity 58 through a resin injection hole 20 in a state in which the outer peripheral portion of the adhesive tape 55 is being interposed between the lower form 57a and the upper form 57b, followed by hardening of the charged resin. Thereafter, the semiconductor element 2 is taken out from the mold 57 to thereby obtain the semiconductor element 2 in which resin sealing has been completed as shown in FIG. 17(c). Further, the adhesive tape 55 extending toward each side of the semiconductor element 2 is cut to obtain the semiconductor device 53 shown in FIG. 16(a).

Figure 16C:
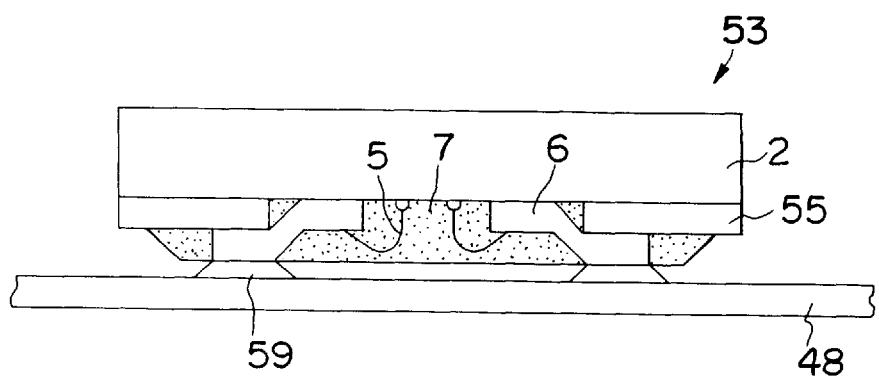
FIG. 16(c) is a fragmentary cross-sectional side view showing a state of implementation of the third embodiment.

Since no dambar is provided in the semiconductor device 53 according to the present embodiment, electrical conduction between the leads 6 and 6 due to continuity between the solder 59 and each dambar will not occur when the semiconductor device 53 is implemented on the printed board 48, using solder 59 as shown in FIG. 16(c). Accordingly, an electrical failure in the above implemented state can be suppressed.

According to the method of manufacturing the semiconductor device 53, since each adhesive layer is provided only at the predetermined position of the adhesive tape 55 for forming each lead frame body, the adhesive tape 55 can be prevented from being cemented to the mold 57 even if the outer peripheral portion of the adhesive tape 55 is interposed between the lower form 57a and upper form 57b of the mold 57 and the mold resin sealing is executed in this condition. Thus, since the resin sealing process can be performed without a hitch, the semiconductor device 53 can be easily manufactured.

Figure 18A:
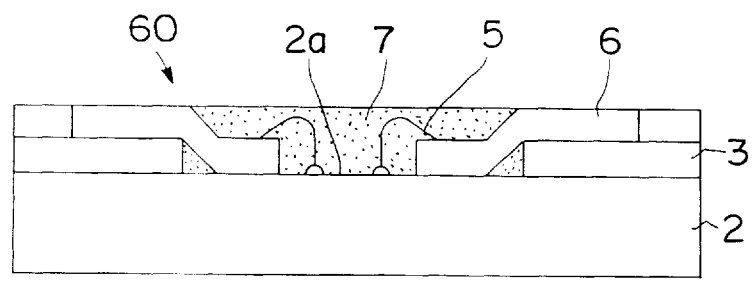
FIG. 18(a) is a cross-sectional side view of the semiconductor device and FIG. 18(b) is a perspective view thereof.
Figure 18B:
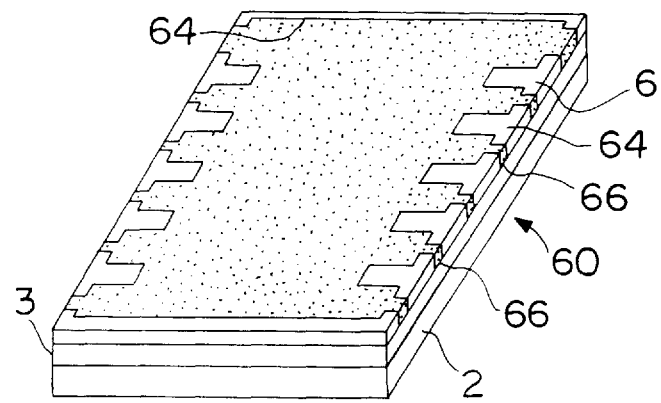

FIGS. 18(a) and 18(b) are respectively views showing one example of a plastic molded type semiconductor device of the present invention, which is obtained by a method of manufacturing the semiconductor device. Reference numerals 60 in FIGS. 18(a) and 18(b) indicate a semiconductor device.

Figure 19:
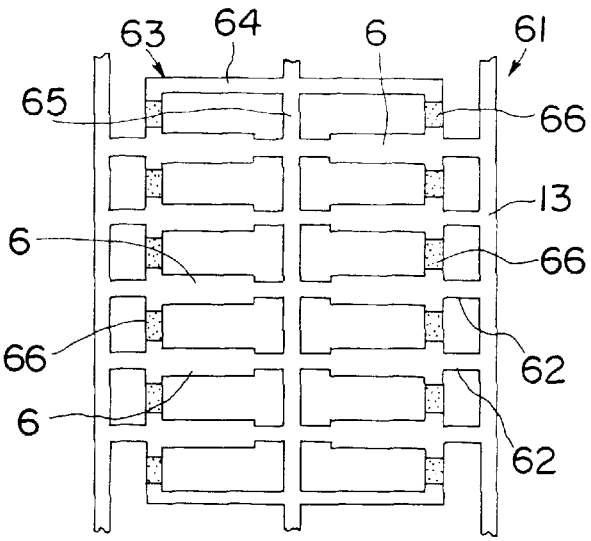
FIG. 19 is a plan view schematically illustrating the configuration of a lead frame used for manufacture of the semiconductor device shown in FIG. 18.

The method of manufacturing the semiconductor device 60 is different from the manufacturing method described with reference to FIGS. 2 through 4 in that a lead frame 61 shown in FIG. 19 is used.

The lead frame 61 comprises a lead frame member 13 and a lead frame body 63 connected to the inside of the lead frame member 13 through a plurality of dambar supports 62. The lead frame body 63 comprises a frame-shaped dambar 64 having an outer shape substantially identical to that of a circuit forming surface 2a of a semiconductor element 2, a plurality of leads 6 extending inwardly of the dambar 64 and connected with the dambar 64, a lead support 65 for connecting between these leads 6 and 6 and connected to the dambar 64, and an adhesive tape (not shown) bonded to these so as to extend from one surface of the dambar 64 to the middle of each lead 6. Resin portions 66, composed of an insulating resin, are formed between all the adjacent leads 6 and 6 within the dambar 64 so as to provide electrical discontinuity (non-conduction) between these leads 6 and 6. The insulating resin used for the resin portion 66 is the same resin as the mold resin to be filled subsequently. The lead frame 61 is different from the lead frame 12 shown in FIGS. 2(a) through 2(e) in that the leads 6 are given metal plating (solder plating) after the completion of mold resin sealing as will be described later, without applying metal plating to the leads 6 in the state of the lead frame.

In order to fabricate the semiconductor device 60, using such a lead frame 61, the lead support 65 is eliminated from the lead frame body 63 in advance. Further, the lead frame body 63 of the lead frame 61 is placed on the circuit forming surface 2a of the semiconductor element 2 in the same manner as the case shown in FIGS. 2 through 4 and fixed to the circuit forming surface 2a with the adhesive tape.

Next, the leads 6 on the semiconductor element 2 and the circuit forming surface 2a of the semiconductor element 2 are electrically connected to each other with gold wires 5. Further, the semiconductor element 2 connected with the gold wires 5 is introduced into a cavity of a mold (not shown). Moreover, the inside of the dambar 64 is filled with the mold resin within the mold to seal the circuit forming surface 2a of the semiconductor element 2. Thereafter, the semiconductor element 2 is taken out from the mold and the leads 6 are given metal plating (solder plating). Further, the dambar supports 62 are cut so as to obtain the semiconductor device 60 shown in FIGS. 18(a) and 18(b).

Since the dambar 64 has the resin portions 66, the semiconductor device 60 obtained in this way can avoid electrical conduction between the adjacent leads 6 and 6 regardless of the fact that the leads 6 are continuously connected to the dambar 64.

According to the method of manufacturing the semiconductor device 60, since the leads 6 are respectively electrically connected to the dambar supports 62 through the dambar 64, the leads 6 can be given solder plating by the use of the dambar supports 62 in the same manner as ever.

Figure 20A:
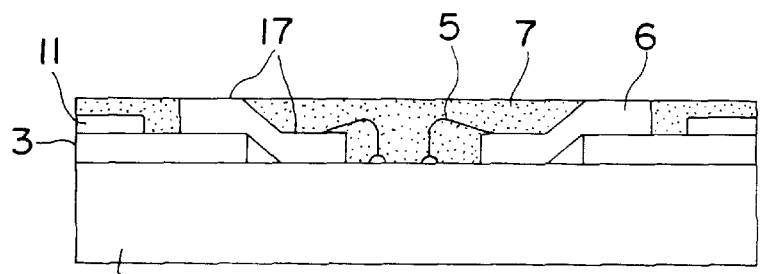
FIG. 20(a) is a cross-sectional side view schematically showing the configuration of the fourth embodiment.
Figure 20B:
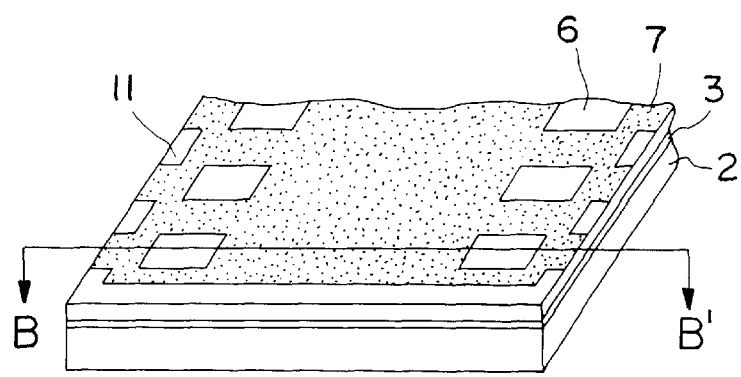
FIG. 20(b) is a perspective view of the fourth embodiment.

FIGS. 20(a) and 20(b) are respectively views showing a fourth embodiment of the present invention.

In the present embodiment, a dambar 11 is subjected to half etching at portions adjacent to leads 6 as shown in FIGS. 20(a) and 20(b). The half-etched portions are covered with a mold resin 7.

Figure 21A:
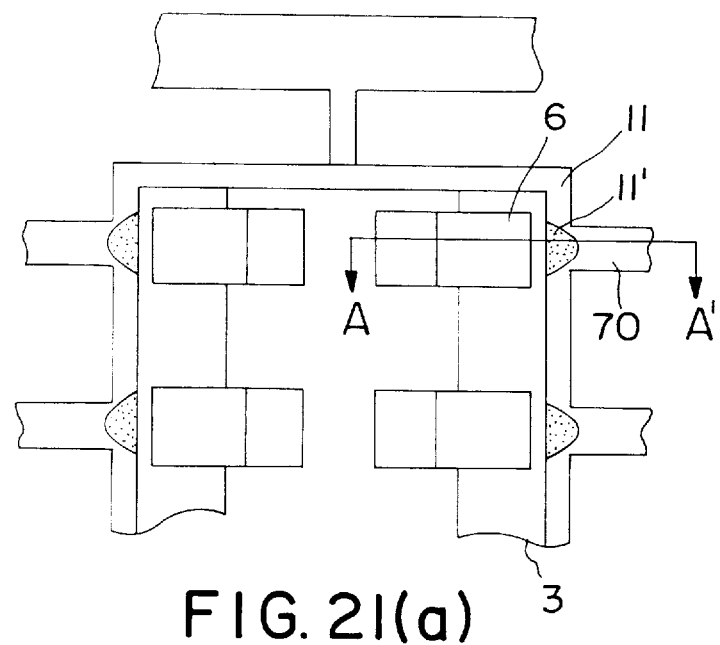
FIG. 21(a) is a top view schematically showing the configuration of the fourth embodiment.
Figure 21B:
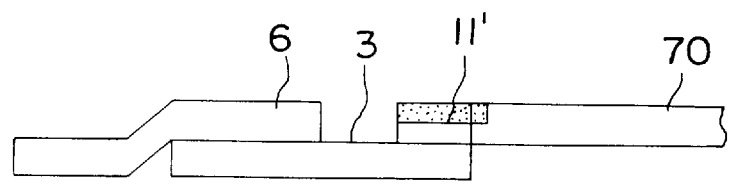
FIG. 21(b) is a cross-sectional view taken along line A–A' in FIG. 21(a)

In a lead frame employed in the present embodiment, as illustrated in FIGS. 21(a) and 21(b), a dambar 11 is subjected to half etching 11' and supports 70 are formed adjacent to the half-etched portions. The supports 70 are used to prevent the half-etched portions 11' from extending out to end surfaces of the dambar 11 and the supports 70. Thus, since only the dambar adjacent to the leads 6 is covered with the resin, the distance between each lead and the dambar 11 increases so that the occurrence of electrical leakage can be reduced.

Further, the half-etched portions are formed within the planes of both the dambar 11 adjacent to the leads and the supports 70 adjacent thereto. Thus, when upper and lower portions of the half-etched portions are held by an unillustrated mold and the resin is injected therein, the resin is introduced into the half-etched portions. Thereafter, the resin stops flowing at the end surfaces of the dambar 11 and the supports 70. Thus, the neighborhood of each lead 6 can be covered with the mold resin.

Figure 22A:
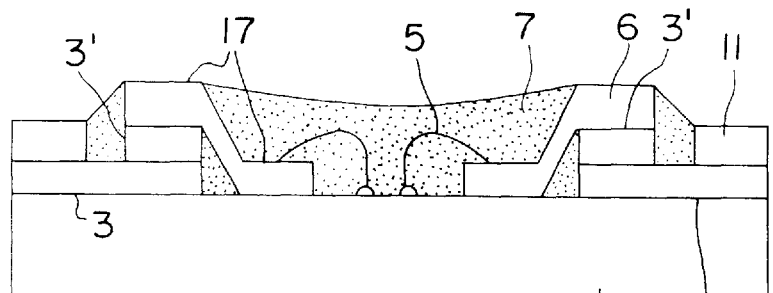
FIG. 22 is a view for describing a fifth embodiment of a plastic molded type semiconductor device of the present invention.
Figure 22B:
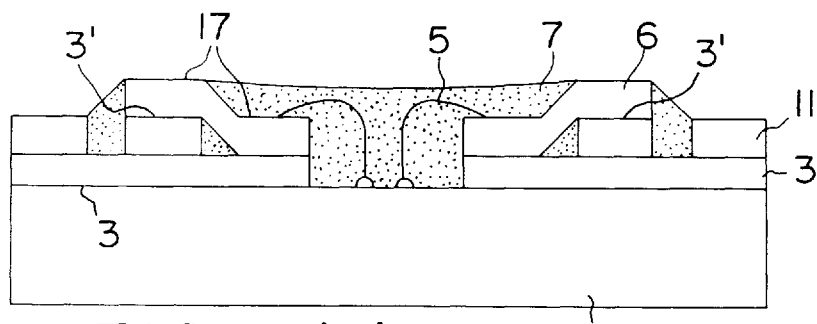
Figure 22C:
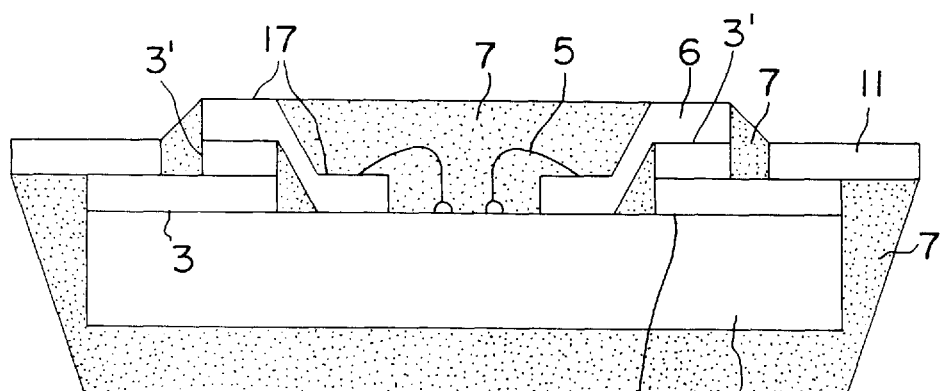
Figure 23A:
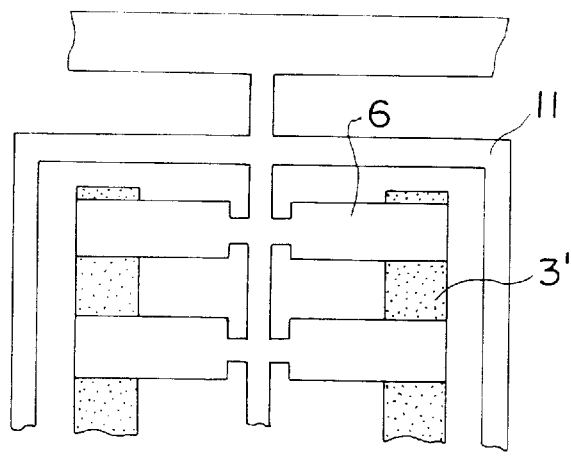
FIGS. 23(a) and 23(c) are respectively top views schematically showing the configuration of the lead frame.
Figure 23B:
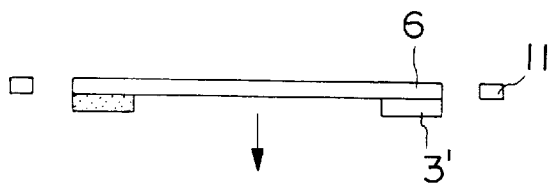
FIGS. 23(b) and 23(d) are respectively cross-sectional views of FIGS. 23(a) and 23(c)
Figure 23C:
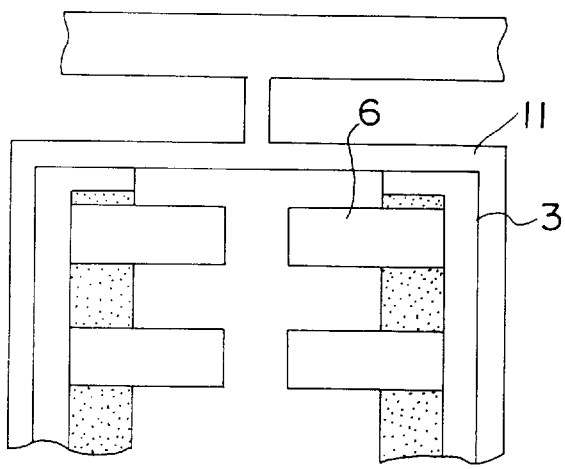
Figure 23D:
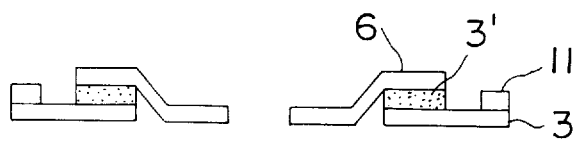

FIGS. 22(a) through 22(c) are respectively views showing applications of a fifth embodiment of the present invention.

The provision of a steplike offset or a difference in level between a dambar 11 and each lead 6 allows a reduction in electrical leakage produced between the dambar 11 and each lead 6.

In these applications, insulating tapes 3 and 3' are provided in double form at leads 6 alone as shown in FIGS. 22(a) through 22(c). Owing to the configuration referred to above, the bottom surface of the outer portion of each lead 6 is elevated by the thickness of the two insulating tape 3 and 3' and the bottom surface of the dambar 11 is only elevated by the thickness of one insulating tape 3. Therefore, a difference in level corresponding to the insulating tape 3' can be formed between the dambar 11 and each lead 6.

FIG. 23 is a view for describing a lead frame employed in each application shown in FIG. 22. FIG. 22(a) is a view showing the manner in which an adhesive tape 3' is bonded to each lead. FIG. 22(b) is a cross-section cut away at a lead in FIG. 22(a). FIG. 22(c) is a view illustrating the manner in which after the insulating tape 3' has been bonded to each lead, an insulating tape 3 is further cemented thereto and each lead 6 is subjected to bending. FIG. 22(d) is a cross-section cut away at the leads in FIG. 22(c). A difference in level corresponding to one insulating tape 3' is formed between the dambar 11 and each lead 6 by forming each lead as shown in FIG. 22(d).

Figure 24A:
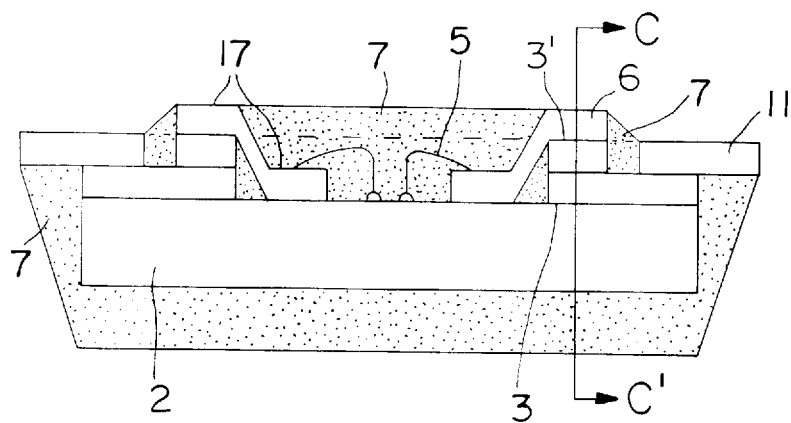
FIGS. 24(a) and 24(b) are respectively cross-sectional side views schematically showing the configuration of the sixth embodiment.
Figure 24B:
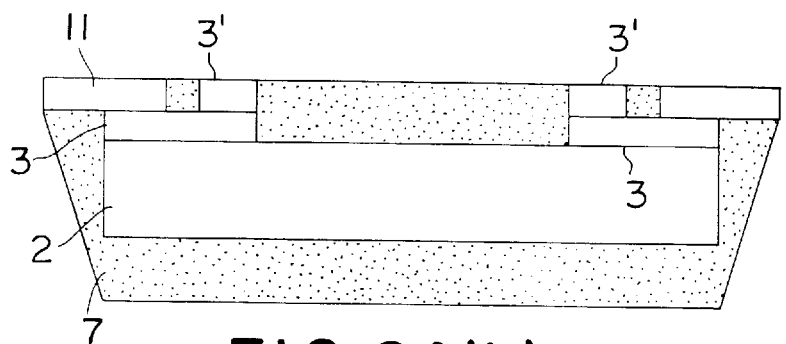
Figure 24C:
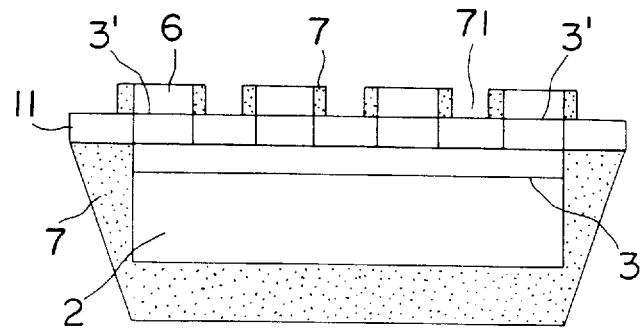
FIG. 24(c) is a cross-sectional view taken along line C–C' in FIG. 24(a)

FIGS. 24(a) through 24(c) are respectively views showing a sixth embodiment of the present invention. In the embodiment shown in FIG. 24, grooves 71 identical in height to a dambar 11 are provided between respective adjacent leads 6. FIG. 24(a) is a cross-section cut away at the leads, FIG. 24(b) is a cross-section cut away at a resin portion, and FIG. 24(c) is a cross-sectional view taken along line C–C' in FIG. 24(a).

In the present embodiment, a difference in level, which corresponds to an insulating tape 3, is provided between the dambar 11 and each lead 6. Further, the grooves 71 identical in height to the dambar 11 are provided between the leads 6. Therefore, electrical leakage produced between the leads 6 and 6 can be reduced as well as electrical leakage produced between the dambar and each leak due to impurities.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A plastic molded type semiconductor device comprising:

a semiconductor element having electrodes provided on a surface thereof;

a dambar formed along the outer periphery of the surface of said semiconductor element;

a plurality of leads each having a lower portion which is electrically connected to one of said electrodes and having an upper portion which is disposed above the surface of the semiconductor element, said upper and lower portions of the leads being provided inside said dambar and being electrically independent of said dambar; and a mold resin body with a region surrounded by said dambar, the mold resin body being formed so as to expose upper surfaces of the upper portions of said leads.

2. A plastic molded type semiconductor device according to claim 1, wherein said dambar and said leads are secured to said semiconductor element by an insulating tape.

3. A plastic molded type semiconductor device according to claim 1, wherein the thickness of said dambar is greater than that of each lead.

4. A plastic molded type semiconductor device according to claim 1, wherein said semiconductor element has a side and a back that are covered with a coating resin.

5. A plastic molded type semiconductor device according to claim 1, wherein the mold resin body has an upper surface, and wherein the mold resin body has an upper surface which is substantially flush with the upper surfaces of the upper portions of the leads.

6. A plastic molded type semiconductor device according to claim 1, wherein the mold resin body has an upper surface, and wherein the dambar has an upper surface that is substantially flush with the upper surface of the mold resin body.

7. A plastic molded type semiconductor device comprising:
   a semiconductor element having electrodes provided on a surface thereof;
   a plurality of leads disposed inside the periphery of the surface of the semiconductor element, each lead being bent so as to provide a lower portion which contacts the surface of the semiconductor element and an upper portion which is spaced apart from the surface of the semiconductor element, the upper portions of the leads having upper surfaces;
   wires for connecting the electrodes of said semiconductor element and said leads to one another;
   an insulating adhesive tape provided between the upper portions of said leads and said semiconductor element so as to fix said leads to said semiconductor element; and
   a mold resin body which exposes the upper surfaces of the upper portions of said leads and which seals the remaining portions of said leads,
   wherein surfaces of said semiconductor element, other than the surface thereof with said leads, are exposed.

8. A plastic molded type semiconductor device according to claim 7, wherein the mold resin body has a planar surface portion which is substantially flush with the upper surfaces of the upper portions of the leads.

9. A plastic molded type semiconductor device according to claim 7, further comprising a dambar which surrounds the molded resin body, the dambar contacting the molded resin body and the surface of the semiconductor element that is provided with the electrodes.

10. A plastic molded type semiconductor device comprising:
    a semiconductor element having electrodes provided on a surface thereof;
    a dambar formed along the outer periphery of the surface of said semiconductor element;
    a plurality of leads respectively electrically connected to said electrodes and provided inside said dambar, said leads being electrically independent of said dambar;
    a fixing material for fixing said dambar and said leads onto the surface of said semiconductor element; and
    a sealing material for sealing the surface of said semiconductor element in a state in which parts of said leads are exposed;
    wherein said dambar has portions corresponding to said leads, which are formed thinner than other portions thereof, and is provided with supports identical in thickness to said other portions around the thin-formed portions.

11. A plastic molded type semiconductor device according to claim 10, wherein the portions of said dambar, which are formed thinner than the other portions thereof, are filled with the sealing material.

12. A plastic molded type semiconductor device according to claim 10, wherein the parts of said leads and said dambar are formed such that their upper surfaces are substantially flush with each other.

13. A plastic molded type semiconductor device comprising:
    a semiconductor element having electrodes provided on a surface thereof;
    an adhesive tape on the surface of said semiconductor element but not covering the electrodes;
    a dambar on the adhesive tape, and substantially surrounding a region where the electrodes are disposed;
    a plurality of leads each having a lower portion which is electrically connected to one of said electrodes and having an upper portion which is disposed above the surface of the semiconductor element, said lower and upper portions of the leads being disposed inside said dambar and being electrically independent of said dambar; and
    a mold resin body within the region surrounded by said dambar, the mold resin body being formed so as to expose upper surfaces of the upper portion of said leads.

14. A plastic molded type semiconductor device to claim 13, wherein said dambar has a thickness which is greater than that of said leads.

15. A plastic molded type semiconductor device to claim 13, wherein said adhesive tape has a first region corresponding to the dambar and a second region corresponding to the upper portions of the leads, and said second region is thicker than said first region.

16. A plastic molded type semiconductor device to claim 13, further comprising grooves provided between adjacent leads.

17. A plastic molded type semiconductor device to claim 13, wherein the mold resin body has an upper surface that is substantially flush with the upper surfaces of the upper portions of the leads.

18. A plastic molded type semiconductor device to claim 13, wherein the leads have inner and outer ends that are disposed inside the dambar.

* * * * *